United States Patent
Noh et al.

(10) Patent No.: US 10,903,857 B2
(45) Date of Patent: Jan. 26, 2021

(54) DATA RETRANSMISSION METHOD FOR POLAR CODE, AND DEVICE THEREFOR

(71) Applicant: LG Electronics Inc., Seoul (KR)

(72) Inventors: Kwangseok Noh, Seoul (KR); Dongkyu Kim, Seoul (KR); Myeongjin Kim, Seoul (KR); Sangrim Lee, Seoul (KR); Hojae Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 53 days.

(21) Appl. No.: 16/310,266

(22) PCT Filed: Jun. 12, 2017

(86) PCT No.: PCT/KR2017/006060
§ 371 (c)(1),
(2) Date: Dec. 14, 2018

(87) PCT Pub. No.: WO2017/217711
PCT Pub. Date: Dec. 21, 2017

(65) Prior Publication Data
US 2019/0140663 A1 May 9, 2019

Related U.S. Application Data

(60) Provisional application No. 62/355,840, filed on Jun. 28, 2016, provisional application No. 62/350,167, filed on Jun. 14, 2016.

(51) Int. Cl.
*H04L 1/18* (2006.01)
*H03M 13/13* (2006.01)
(Continued)

(52) U.S. Cl.
CPC ......... *H03M 13/13* (2013.01); *H03M 13/618* (2013.01); *H03M 13/6306* (2013.01);
(Continued)

(58) Field of Classification Search
CPC ... H04L 1/1621; H04L 1/1671; H04L 1/0073; H04L 1/0081; H04L 5/0055; H04L 1/08;
(Continued)

(56) References Cited

U.S. PATENT DOCUMENTS

2009/0052418 A1* 2/2009 Semper ................. H04W 24/02
370/338
2014/0019820 A1 1/2014 Vardy et al.
(Continued)

FOREIGN PATENT DOCUMENTS

| KR | 1020110060635 | 6/2011 | |
|---|---|---|---|
| KR | 1020110112875 | 10/2011 | |
| WO | WO-2017157027 A1 * | 9/2017 | ............. H04J 11/00 |

OTHER PUBLICATIONS

PCT International Search Report and Written Opinion in International ,Appln. No. PCT/KR2017/006060, dated Sep. 12, 2017, 18 pages.
(Continued)

*Primary Examiner* — Albert Decady
*Assistant Examiner* — Enam Ahmed
(74) *Attorney, Agent, or Firm* — Fish & Richardson P.C.

(57) ABSTRACT

A data retransmission method for a polar code, and a device therefor are disclosed. The data retransmission method of the disclosure can comprise the steps of: generating a first data block by allocating a plurality of data bits to input bits, with high priorities, among input bits of a polar code encoding module on the basis of a target encoding rate; transmitting the generated first data block; generating a second data block by allocating first data bits among the plurality of data bits to input bits, with low priorities, among the input bits of the polar code encoding module, on the basis of the target encoding rate and shortening bits; and
(Continued)

transmitting the generated second data block as a retransmission of the first data block.

10 Claims, 24 Drawing Sheets

(51) Int. Cl.
*H04L 1/00* (2006.01)
*H03M 13/00* (2006.01)
*H03M 13/25* (2006.01)

(52) U.S. Cl.
CPC ............... *H04L 1/00* (2013.01); *H04L 1/007* (2013.01); *H04L 1/0041* (2013.01); *H04L 1/0057* (2013.01); *H04L 1/18* (2013.01); *H03M 13/258* (2013.01)

(58) Field of Classification Search
CPC ..... H04L 1/1896; H04L 1/189; H04L 1/1887; H04L 1/1854; H04L 1/1607; H04L 1/0025; H04L 1/00; H04L 1/007; H04L 1/0041; H04L 1/0057; H04L 1/18; H03M 13/13; H03M 13/6306; H03M 13/618; H03M 13/258

USPC ......................................................... 714/758
See application file for complete search history.

(56) References Cited

U.S. PATENT DOCUMENTS

| | | | |
|---|---|---|---|
| 2015/0128006 A1* | 5/2015 | Alhussien | H03M 13/612 714/758 |
| 2016/0079999 A1* | 3/2016 | Shen | H03M 13/27 714/758 |
| 2016/0285479 A1* | 9/2016 | El-Khamy | H03M 13/6368 |
| 2019/0190654 A1* | 6/2019 | You | H04B 7/00 |

OTHER PUBLICATIONS

Huawei, HiSilicon, "Polar codes—encoding and decoding", R1-164039, 3GPP TSG RAN WG1 Meeting #xx, Nanjing, China, May 23-27, 2016, 7 pages.

Intel Corporation, "Polar code design for NR", R1-164184, 3GPP TSG RAN WG1 Meeting #85, Nanjing, China, May 23-27, 2016, 4 pages.

* cited by examiner

FIG. 7

$$H = \begin{bmatrix} p^{h^b_{00}} & p^{h^b_{01}} & p^{h^b_{02}} & \cdots & p^{h^b_{0n_b}} \\ p^{h^b_{10}} & p^{h^b_{11}} & p^{h^b_{12}} & \cdots & p^{h^b_{1n_b}} \\ \cdots & \cdots & \cdots & \cdots & \cdots \\ p^{h^b_{m_b 0}} & p^{h^b_{m_b 1}} & p^{h^b_{m_b 2}} & \cdots & p^{h^b_{m_b n_b}} \end{bmatrix} = p^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

DATA RETRANSMISSION METHOD FOR POLAR CODE, AND DEVICE THEREFOR

CROSS-REFERENCE TO RELATED APPLICATIONS

This application is a National Stage application under 35 U.S.C. § 371 of International Application No. PCT/KR2017/006060, filed on Jun. 12, 2017, which claims the benefit of U.S. Provisional Application No. 62/355,840, filed on Jun. 28, 2016, and U.S. Provisional Application No. 62/350,167, filed on Jun. 14, 2016. The disclosures of the prior applications are incorporated by reference in their entirety.

TECHNICAL FIELD

The present invention relates to a method of encoding a channel code in a wireless communication system and, more particularly, to a method of retransmitting data for a polar code and an apparatus therefor.

BACKGROUND ART

A wireless access system has been widely deployed to provide a diverse range of communication services such as a voice communication service and a data communication service. Generally, the wireless access system is a multiple access system capable of supporting communication with multiple users by sharing available system resources (e.g., bandwidth, transmit power, etc.). For example, the multiple access system may include one of a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, a multi-carrier frequency division multiple access (MC-FDMA) system, and the like.

In a broadcast system as well as in the above-described communication system, a channel code is necessarily used. As an example of a general configuration method of the channel code, a transmitter may encode an input symbol using an encoder and transmit the encoded symbol. A receiver, for example, may receive the encoded symbol and decode the received symbol, thereby recovering the input symbol. In this case, the size of the input symbol and the size of the encoded symbol may be differently defined according to a communication system. For example, in a turbo code for data information used in a 3rd generation partnership project (3GPP) long term evolution (LTE) communication system, the size of the input symbol is a maximum of 6144 bits and the size of the encoded symbol is 18432 (6144*3) bits. For turbo coding of the LTE communication system, reference is made to 3GPP technical specification 36.212.

However, even when a signal-to-noise ratio (SNR) increases, the LTE turbo code is characterized in that performance improvement is not remarkable out of a predetermined region due to the structure of the code. Regarding this problem, although use of a code having a low error rate may be considered, complexity increases.

In a communication system, a high error rate may require unnecessary retransmission of data and cause failure in channel reception. In addition, a code having excessively high complexity may increase overhead of a base station (BS) and a user equipment (UE) and cause transmission and reception latency. Especially, in a future-generation communication system requiring faster data transmission and reception, the above-described problems need to be solved. Therefore, a coding method having low complexity while lowering an error rate is demanded.

Particularly, the current LTE turbo codes are problematic in that error floor occurs as the size of information increases. Therefore, a channel coding method capable of satisfying ultra-reliable radio (URR) and low-latency radio (LLR) is needed.

DISCLOSURE

Technical Problem

An object of the present invention devised to solve the problems is to provide a method of retransmitting data for a polar code.

Another object of the present invention is to provide an apparatus supporting the above method.

The present invention is not limited to what has been particularly described hereinabove and other technical objects can be derived from embodiments of the present invention.

Technical Solution

According to an aspect of the present invention, provided herein is a method of retransmitting a data block by a user equipment. The method comprises generating a first data block by allocating a plurality of data bits to input bits having a high priority among input bits of a polar code encoding module based on a target code rate; transmitting the generated first data block; generating a second data block by allocating first data bits among the plural data bits to input bits having a low priority among the input bits of the polar code encoding module based on the target code rate and shortening bits; and transmitting the generated second data block as retransmission of the first data block.

The method of retransmitting the data block may further include generating a third data block by allocating second data bits among remaining data bits except for the first data bits among the plural data bits to input bits having a low priority among the input bits of the polar code encoding module based on the code rate and the shortening bits; and transmitting the generated third data block as retransmission of the first data block, wherein the second data bits may be selected from among the remaining data bits in ascending order of reliability.

The method of retransmitting the data block may further include electively transmitting at least a part of the plural data bits in descending order of reliability when all of the plural data bits are retransmitted due to repetitive retransmission of the first data block.

The first data block may correspond to a transport block or a code block.

Retransmission of the first data block may be performed based on a negative acknowledgement response from a receiving end.

According to another aspect of the present invention, provided herein is a user equipment including a transceiver for transmitting and receiving a signal; a memory; and a processor for controlling the transceiver and the memory. The processor may be configured to: generate a first data block by allocating a plurality of data bits to input bits having a high priority among input bits of a polar code encoding module based on a target code rate, transmit the generated first data block, generate a second data block by allocating first data bits among the plural data bits to input bits having a low priority among the input bits of the polar code encoding module based on the target code rate and shortening bits, and transmit the generated second data block as retransmission of the first data block.

The foregoing aspects of the present invention are merely a part of the embodiments of the present invention and various embodiments into which the features of the present invention are incorporated can be derived and understood by persons skilled in the art from the following detailed description of the present invention.

Advantageous Effects

Embodiments of the present invention have the following effects.

According to the method of retransmitting data of a polar code of the present invention, retransmission of the same code rate can be performed.

According to the method of retransmitting data of a polar code of the present invention, a difference in reliability between data can be reduced by transmitting a data bit having low reliability according to retransmission of data.

The effects that can be achieved with the present invention are not limited to what has been particularly described hereinabove and other advantages not described herein will be more clearly understood by persons skilled in the art from the following detailed description of the present invention. That is, unintended effects of the present invention may also be derived by those skilled in the art from the embodiments of the present invention.

BRIEF DESCRIPTION OF THE DRAWINGS

The accompanying drawings, which are included to provide a further understanding of the invention, and are incorporated in and constitute a part of this specification, illustrate various embodiments of the invention and together with the description serve to explain the principle of the invention.

FIG. 7 illustrates an exemplary structured parity check matrix.

FIG. 8 illustrates an exemplary model matrix.

FIG. 18 illustrates exemplary determination of data bits and frozen bits.

MODE FOR CARRYING OUT THE INVENTION

The following technology may be applied to a variety of wireless access systems using code division multiple access (CDMA), frequency division multiple access (FDMA), time division multiple access (TDMA), orthogonal frequency division multiple access (OFDMA), single carrier frequency division multiple access (SC-FDMA), and the like. CDMA may be embodied through radio technology such as universal terrestrial radio access (UTRA) or CDMA2000. TDMA may be embodied through radio technology such as global system for mobile communications (GSM)/general packet radio service (GPRS)/enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802-20, and evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in downlink and SC-FDMA in uplink. LTE-advanced (LTE-A) is an evolved version of 3GPP LTE.

For clarity of description, the following description focuses on the 3GPP LTE/LTE-A system. However, the technical features of the present invention are not limited thereto. Specific terms used in the following description are provided to aid in understanding the present invention. These specific terms may be replaced with other terms within the scope and spirit of the present invention.

Figure 1:
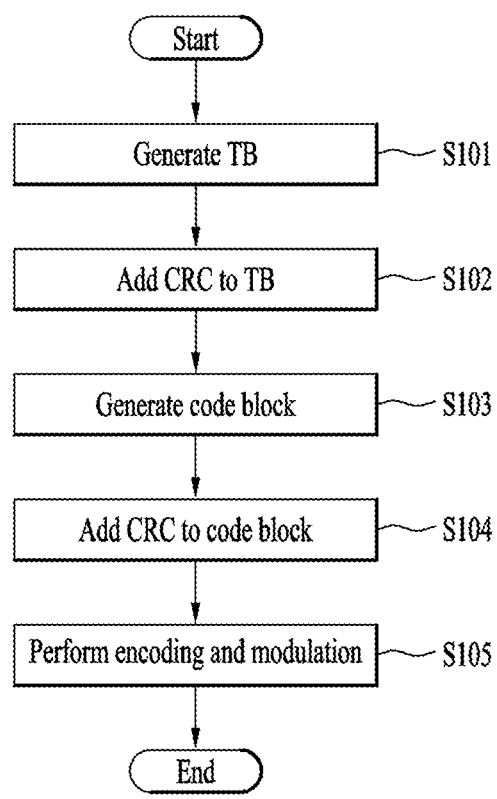
FIG. 1 illustrates an exemplary encoding procedure.

FIG. 1 illustrates an exemplary encoding procedure.

The encoding procedure as illustrated in FIG. 1 may be applied to numerous channel codes including a turbo code used in the LTE communication system. Hereinafter, for convenience of description, the encoding procedure will be described based on terms according to the standard specifications of the LTE communication system.

In the example of FIG. 1, a transmitter may generate a transport block (TB) (step S101). The transmitter adds a cyclic redundancy check (CRC) bit for the TB to the TB (step S102). The transmitter may generate code blocks from the TB to which the CRC bits are added (step S103). For example, the transmitter may segment the TB into the code blocks based on an input size of an encoder. The transmitter may add the CRC bits to each of the segmented code blocks (step S104). In this case, the size of the code block and the code block CRC bits may be 6144 bits. The transmitter may perform encoding and modulation with respect to each block which consists of a code block and code block CRC bits (step S105). For example, turbo coding may be applied as described previously.

A decoding procedure may be performed in a reverse order of the encoding procedure of FIG. 1. For example, a receiver may decode each code block using a decoder corresponding to each encoder, configure one final TB, and perform CRC confirmation for the TB.

For example, the size of an input symbol may be different from the size of a TB from a media access control (MAC) layer. If the size of the TB is greater than a maximum size of the input symbol of the turbo code, the TB may be segmented into a plurality of code blocks (CBs). According to standard of the LTE communication system, the size of the CB may be equal to a value obtained by subtracting the CRC bits from 6144 bits. The input symbol of the turbo code may be defined as data including a CB and a CRC or data including a TB (e.g., the size of the TB is less than 6144 bits) and a CRC. The CRC bits are significantly less than 6144 bits (e.g., the CRC bits are a maximum of 24 bits). Therefore, in the following description, a CB may refer to a CB itself or a CB and corresponding CRC bits and a TB may refer to a TB itself or a TB and corresponding CRC bits, unless defined otherwise).

Figure 2:
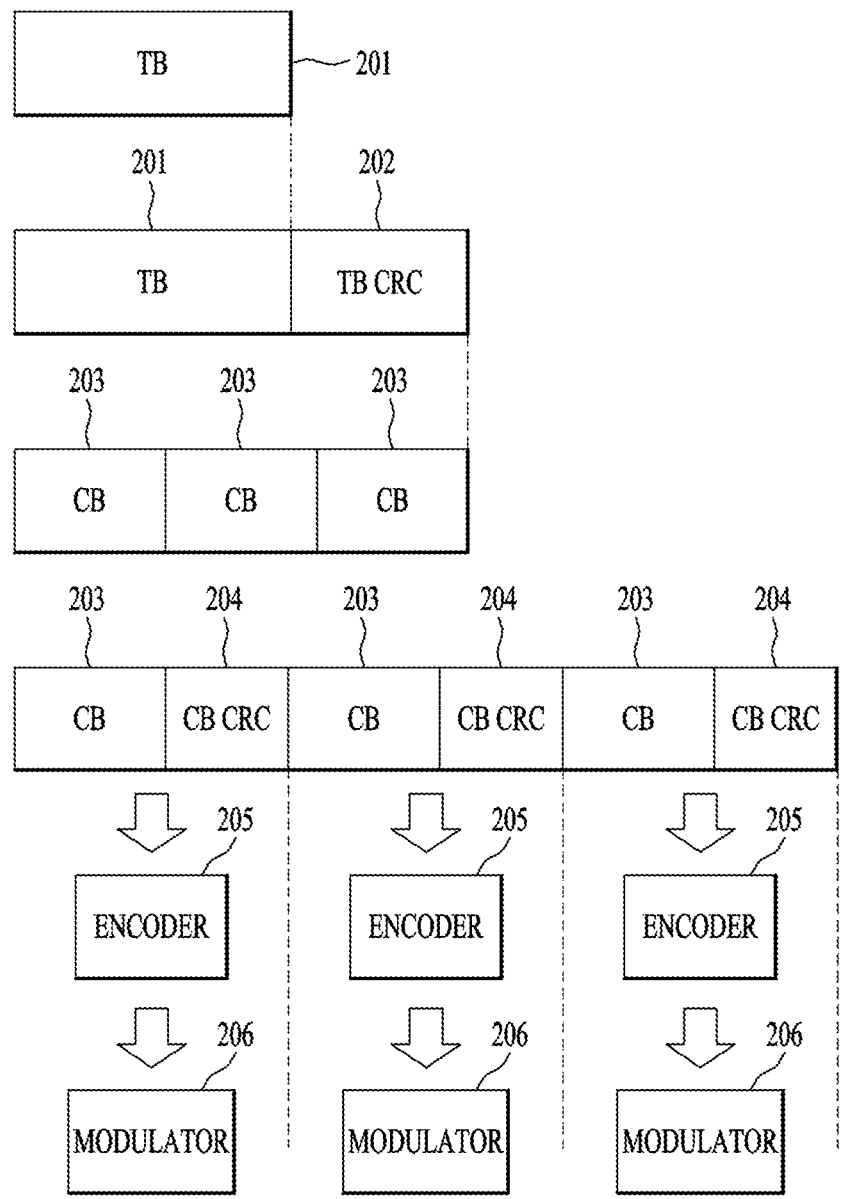
FIG. 2 illustrates an exemplary transport block (TB) encoding procedure.

FIG. 2 illustrates an exemplary TB encoding procedure.

FIG. 2 illustrates an encoding procedure of a TB 201 corresponding to the above-described encoding procedure in relation to FIG. 1. First, a TB CRC 202 is added to the TB 201. The TB CRC 202 may be used to confirm the TB 201 during a decoding procedure. Next, the TB 201 and the TB CRC 202 are divided into three CBs 203. In this embodiment, while the TB 201 and the TB CRC 202 are divided into the three CBs 203, the TB 201 may be divided into a plurality of CBs based on the input size of an encoder 205.

CB CRCs 204 are added to the respective CBs 203. The CB CRCs 204 may be used to confirm the CBs 203 by the receiver. The CBs 203 and the CB CRCs 204 may be encoded through respective encoders 205 and respective modulators 205.

Figure 3:
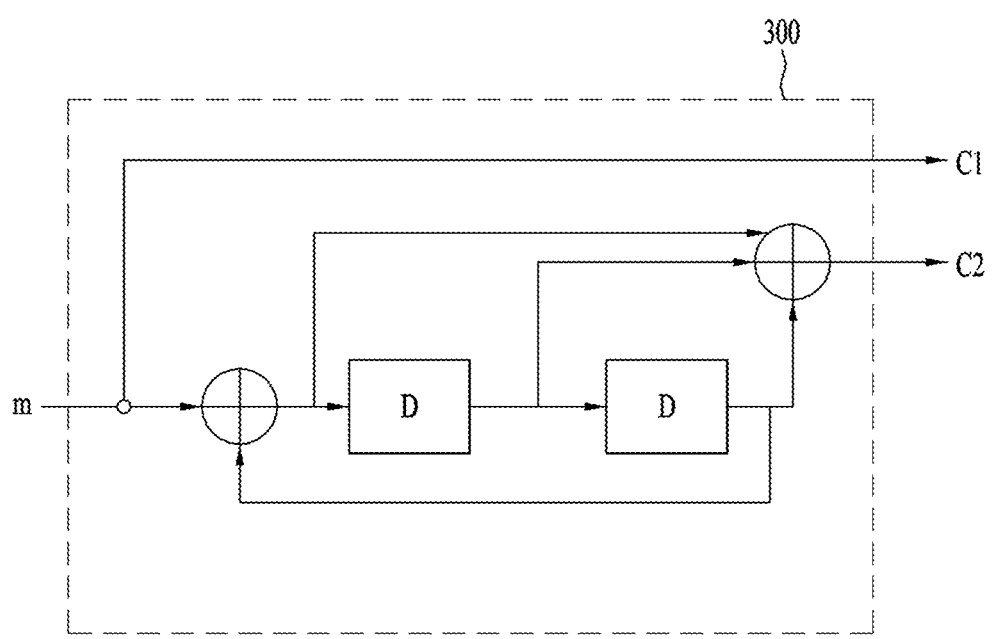
FIG. 3 illustrates an exemplary recursive systematic convolutional (RSC) encoder.

FIG. 3 illustrates an exemplary recursive systematic convolutional (RSC) encoder.

An RSC encoder 300 of FIG. 3 may be used for turbo coding. In FIG. 3, m denotes input data, C1 denotes a systematic bit stream, and C2 denotes a coded bit stream. Herein, the RSC encoder 300 has a code rate of ½.

The RSC encoder 300 may be configured by feeding back an encoded output to an input of a non-recursive, non-systematic convolutional encoder. In the embodiment of FIG. 3, the encoder 300 includes two delayers 301 and 302. A value D of each of the delayers 301 and 302 may be determined according to a coding scheme. The delayers 301 and 302 may be configured by memories or shift registers.

Figure 4:
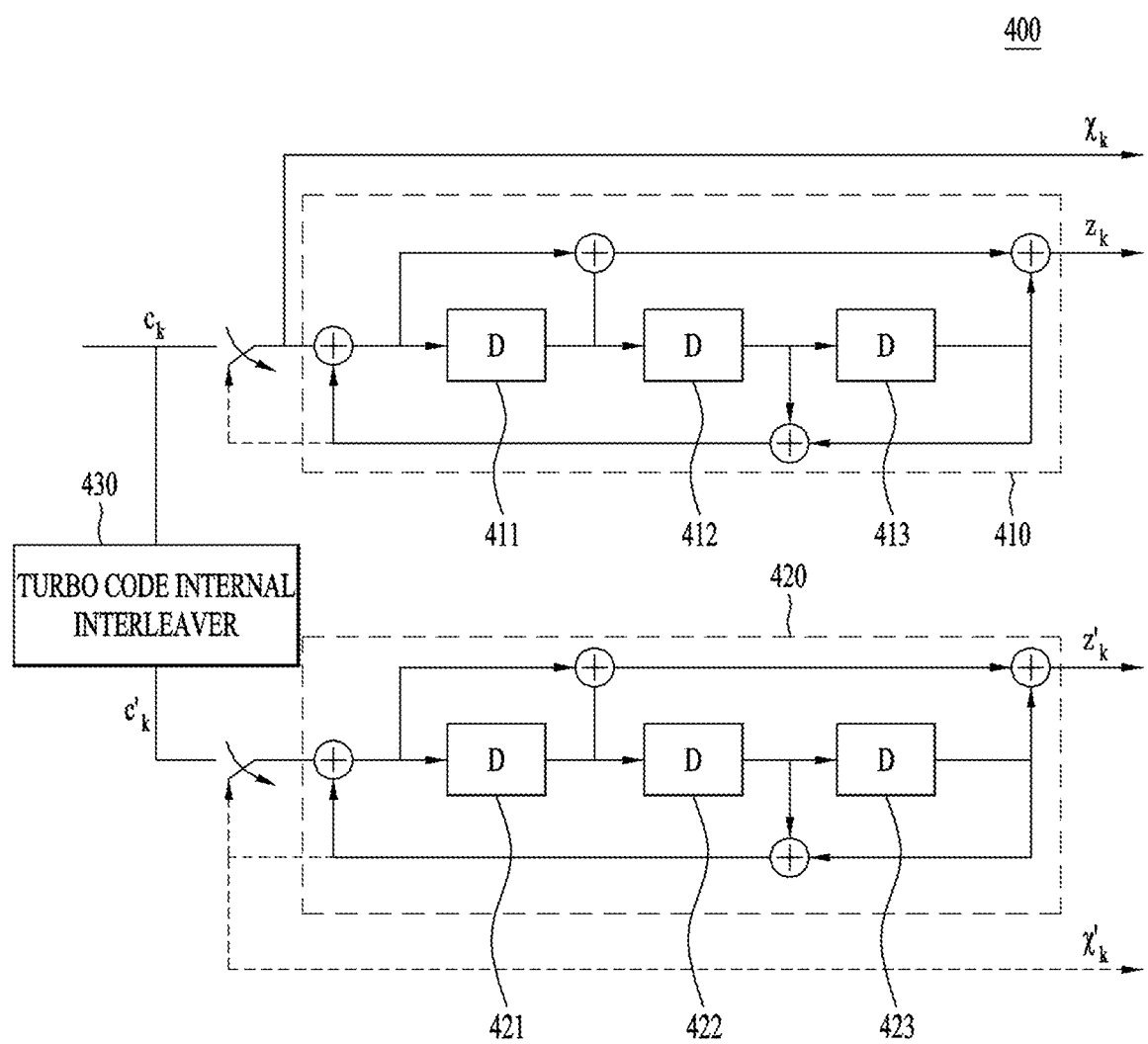
FIG. 4 illustrates an LTE turbo encoder.

FIG. 4 illustrates an LTE turbo encoder.

A coding scheme of an LTE turbo encoder 400 uses a parallel concatenated convolutional code (PCCC) implemented through two 8-state constituent encoders 410 and 420 and one turbo code internal interleaver 430.

In FIG. 4, the turbo encoder 400 includes the first constituent encoder 410, the second constituent encoder 420, and the turbo code internal interleaver 430. The first constituent encoder 410 and the second constituent encoder 420 are 8-state constituent encoders. Each of the first constituent encoder 410 and the second constituent encoder 420 has a structure similar to the RSC encoder of FIG. 3. The first constituent encoder 410 and the second constituent encoder 420 include three delayers 411, 412, and 413 and three delayers 421, 422, 423, respectively.

In FIG. 4, D denotes a value determined based on a coding scheme. $c_k$ denotes an input to the turbo encoder 400. Outputs from the first constituent encoder 410 and the second constituent encoder 420 are denoted as $z_k$ and $z'_k$, respectively. An output from the turbo code internal interleaver 430 is denoted as $c'_k$. Generally, each of the delayers 411, 412, 413, 421, 422, and 423 may delay an input value by one clock. However, each of the delayers 411, 412, 413, 421, 422, and 423 may be configured to delay the input value by more than one clock according to internal configuration. Each of the delayers 411, 412, 413, 421, 422, and 423 may be comprised of a shift register and may be configured so as to delay an input bit by a preset clock and then output the input bit therethrough.

The turbo code internal interleaver 430 may reduce an effect of a burst error which may be generated during signal transmission on a radio channel. For example, the turbo code internal interleaver 430 may be a quadratic polynomial permutation (QPP) interleaver.

A turbo code is a high-performance forward error correction (FEC) code used in the LTE communication system. For example, a data block coded by the turbo code may include three subblocks. One subblock may correspond to m-bit payload data. Another subblock may include n/2 parity bits for a payload, calculated using an RSC code. In addition, the other subblock may include n/2 parity bits for permutation of payload data, calculated using the RSC code. For example, the above permutation may be performed by the interleaver. Accordingly, the two different subblocks of parity bits may constitute one block together with the subblock for the payload. As an example, when m is equal to n/2, one block has a code rate of ⅓.

In the first constituent encoder 410, a procedure in which the input $c_k$ reaches the encoded bit $z_k$ may be divided into two paths. The two paths include a first path connected to an output stage from an input stage without feedback and a second path fed back from the input stage back to the input stage.

On the first path, the input $c_k$, the input $c_k$ passing through the delayer 411, and the input $c_k$ passing through the delayers 411, 412, and 413 are supplied to the output stage. A relationship between the input stage and the output stage for the first path may be expressed as a polynomial. The polynomial for the first path is referred to as a forward generator polynomial and may be expressed as g1 of the following equation indicated below.

$$g1(D) = 1 + D + D^3 \qquad \text{Equation 1}$$

Meanwhile, on the second path, the input $c_k$, the input $c_k$ passing through the delayers 411 and 142, and the input $c_k$ passing through the delayers 411, 412, and 413 are fed back to the input stage. A polynomial for the second path is referred to as a recursive generator polynomial and may be expressed as g0 of the following equation indicated below.

$$g0(D) = 1 + D^2 + D^3 \qquad \text{Equation 2}$$

In Equations 1 and 2, "+" denotes exclusive OR (XOR) and 1 represents that an input is subjected to delay zero times. In addition, $D^n$ represents that an input is subjected to delay n times.

Figure 5:
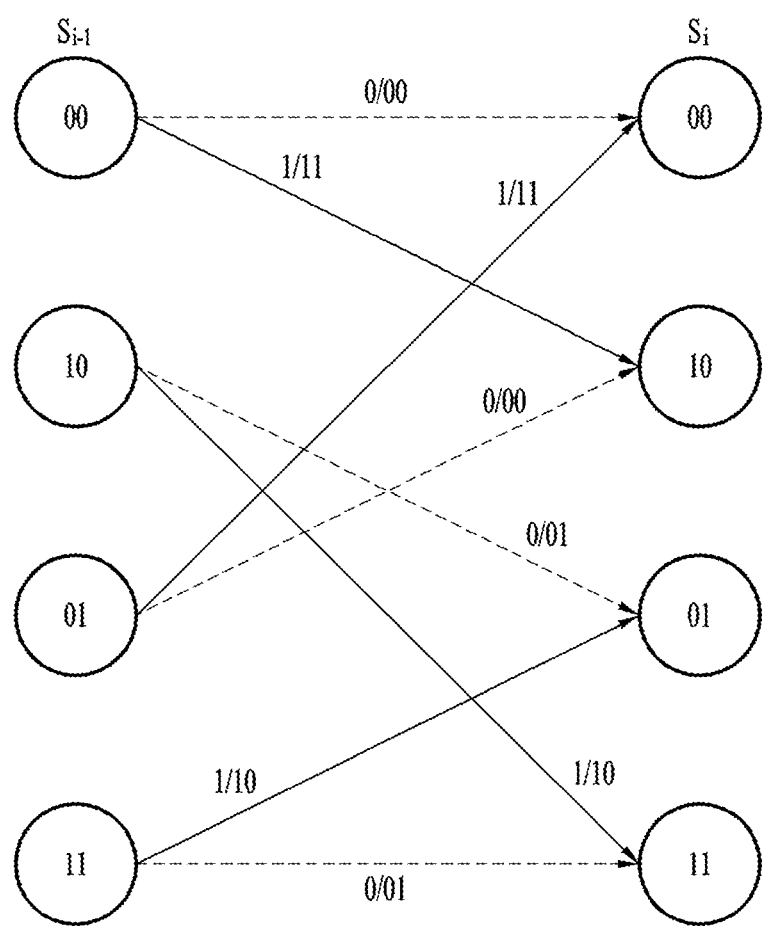
FIG. 5 illustrates an exemplary trellis according to an RSC encoder.

FIG. 5 illustrates an exemplary trellis according to an RSC encoder.

FIG. 5 illustrates the structure of the trellis of the RSC encoder of FIG. 3. In FIG. 5, $S_i$ denotes a state of i-th input data. In FIG. 5, each circle denotes a node. A line between nodes denotes a branch. A branch of a real line means a branch for an input value 1 and a branch of a dotted line means a branch for an input value 0. A value on the branch is expressed as m/C1C2 (input value/systematic bit, encoded bit). The trellis may have states exponentially proportional to the number of memories of the encoder. For example, if the encoder includes a memories, $2^a$ states may be included in the trellis.

The trellis is a state machine illustrating state transition of an encoder allowable two states. A convolutional encoder such as the RSC encoder may perform encoding according to a trellis diagram. A codeword encoded by the RSC encoder may be decoded according to an algorithm based on a trellis structure. For example, a Viterbi or Bahl, Cocke, Jelinek and Raviv (BCJR) algorithm may be used.

Figure 6:
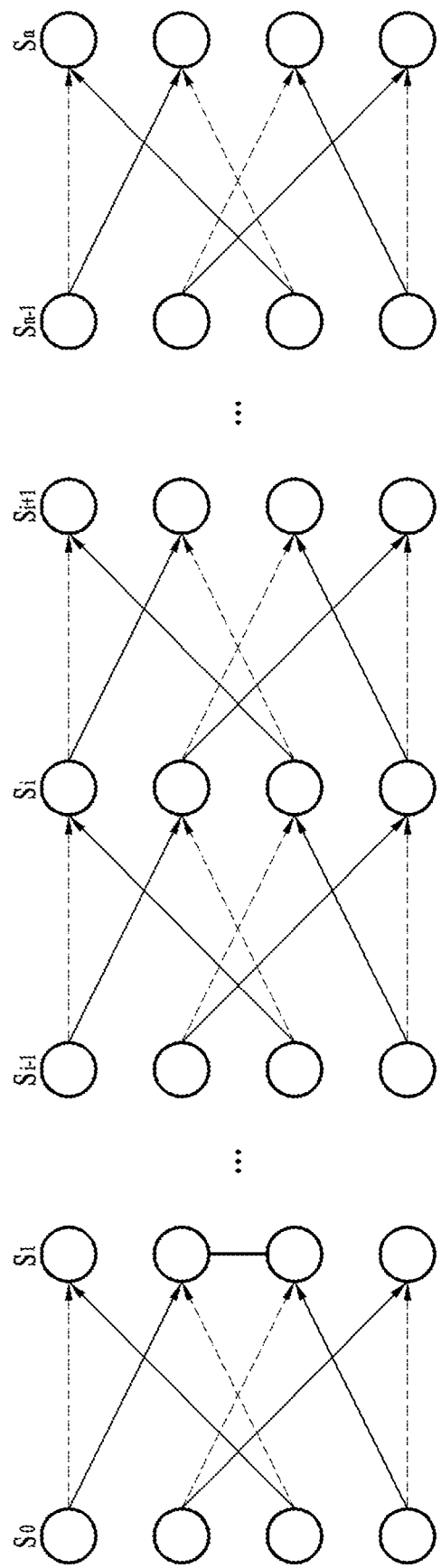
FIG. 6 illustrates an exemplary trellis structure.

FIG. 6 illustrates an exemplary trellis structure.

In FIG. 6, n denotes the length of a codeword. Typically, additional bits are added to the end of an input sequence, thereby terminating a trellis. Generally, a sequence consisting of 0s is referred to as tail bits. The tail bits terminate the trellis by causing nodes of one state of the trellis to have a value of 0.

In FIG. 6, the length of the codeword may be determined in consideration of the length k of input data and the length t of tail bits. For example, when a code rate is R, the length n of the codeword may have a value of (k+t)/R. Generally, the length t of the tail bits may be determined as a length with which all delays (e.g., memories) of an encoder can be reset. As an example, the RSC encoder of FIG. 3 may use a total of two tail bits. In addition, the turbo encoder of LTE communication as illustrated in FIG. 4 may use three tail bits.

The tail bits have a relatively short length as compared with the length of input data. As described above, since the length of the codeword is associated with the length of the tail bits, if the length of the codeword is limited, code rate loss may occur due to the tail bits. However, although code rate loss is generated due to the tail bits, trellis termination using the tail bits is widely used because of low complexity of calculation and excellent error correction performance.

Puncturing is a scheme of puncturing a part of codewords. Through puncturing, since a part of codewords is punctured, partial codewords are not transmitted. For example, puncturing may be used to reduce code rate loss caused by addition of the tail bits. In this case, a receiver may perform decoding using a trellis corresponding to the sum of the length k of the input data and the length t of the tail bits. That is, the receiver may perform decoding under the assumption that the receiver has received codewords which are not punctured. In this case, the receiver may regard a branch from a node corresponding to a punctured bit (i.e., a bit which is not transmitted by a transmitter) as having no input value. That is, it is assumed that the input data for branches of a corresponding node is 0 or 1 with the same possibility.

As described above in relation to FIG. 1, a CRC for a CB is added to the CB. The CRC may be determined as a remainder derived after data to be transmitted is divided by a preset check value used as a divisor. Generally, the CRC may be added to the end of the transmission data. The receiver may compare the remainder after reception data is divided by the preset check value with the CRC or determine whether a remainder after entire reception data including the CRC is divided by the check value is 0.

If the size of a TB is 6144 bits, the size of the CRC may be a maximum of 24 bits. Accordingly, the other bits except for the CRC bits may be determined as the size of the CB.

The receiver may perform decoding with respect to each CB. Thereafter, the receiver may configure the TB from CBs and determine whether decoding has been successfully performed by checking the CRC for the TB. In a current LTE system, a CB CRC is used for early decoding termination. For example, if a CRC for one CB fails, the receiver may not decode the other CBs and transmit a negative acknowledgement (NACK) to the transmitter.

Upon receiving NACK, the transmitter may retransmit at least a part of transmission data. For example, the transmitter may retransmit a TB or one or more CBs. As an example, when the transmitter retransmits all of the TB, radio resources for retransmission may be excessively consumed. In addition, for example, when the receiver generates NACK due to failure of a CB CRC, the receiver may transmit information about a CB (e.g., an index of a CB) in which CRC failure has occurred to the transmitter. The transmitter may increase the efficiency of radio resources by transmitting only the CB in which CRC failure has occurred using the information about the CB. However, if the number of CBs increases, the amount of data for feeding back the information about the CBs (e.g., indexes of the CBs) increases.

In the LTE communication system, the receiver may inform the transmitter through an ACK/NACK signal whether data has been successfully received. In the case of frequency division duplex (FDD), ACK/NACK for data received in an i-th subframe is transmitted in an (i+4)-th subframe. If NACK is received in the (i+4)-th subframe, retransmission may be performed in an (i+8)-th subframe. This is to consider a time for processing the TB and a time for generating ACK/NACK because channel code processing for processing the TB consumes much time. In the case of time division duplex (TDD), ACK/NACK and retransmission subframes may be determined based on a time for processing the TB, a time for generating ACK/NACK, and uplink subframe allocation (e.g., TDD uplink/downlink configuration). In addition, ACK/NACK bundling and multiplexing may be used.

As described above, the turbo code shows restricted improvement in an error rate if an SNR exceeds a predetermined value. As an alternative to the turbo code, a low-density parity-check (LDPC) code has been proposed. The LDPC code is a linear block code and is used in IEEE 802.11n and 802.11ac and digital video broadcasting (DVB). The LDPC code may include a generation matrix and a parity check matrix. In the LDPC code, data may be encoded through a multiplication operation of message bits and the generation matrix. Generally, in communication specification using the LDPC code, the parity check matrix may be used instead of the generation matrix. For example, data may be encoded using the parity check matrix.

The linear block code may be generated based on a generation matrix G or a parity check matrix H. The linear block code is configured such that the product $Hc^t$ of a transpose matrix of a codeword c and the parity check matrix has a value of 0 with respect to the whole codeword c. Decoding of the LDPC code may be performed, as identical to other linear block codes, by checking whether the product of the parity check matrix H and the codeword c is '0'. For example, decoding of the LDPC code may be performed by checking whether the product (i.e., $Hc^t$) of a transpose matrix of the codeword c and the parity check matrix is 0.

In the LDPC code, most elements of the parity check matrix are 0 and there are a small number of elements having values other than 0 as compared with the length of the code. Therefore, the LDPC code may perform iterative decoding based on probability. In an initially proposed LDPC code, the parity check matrix has been defined in a non-systematic form and a small weight has been uniformly applied to rows and columns of the parity check matrix. A weight may mean the number of 1s included in a row or a column.

As described above, the density of elements having values other than 0 in a parity check matrix H of the LDPC code is low. Accordingly, the LDPC code has performance approximating to limits of Shannon's theorem while decoding complexity is kept low. Due to high error correction performance and low decoding complexity of this LDPC code, the LDPC code is suitable for high-speed wireless communication.

Hereinafter, a (structured) LDPC code will described.

Figures 7, 8:
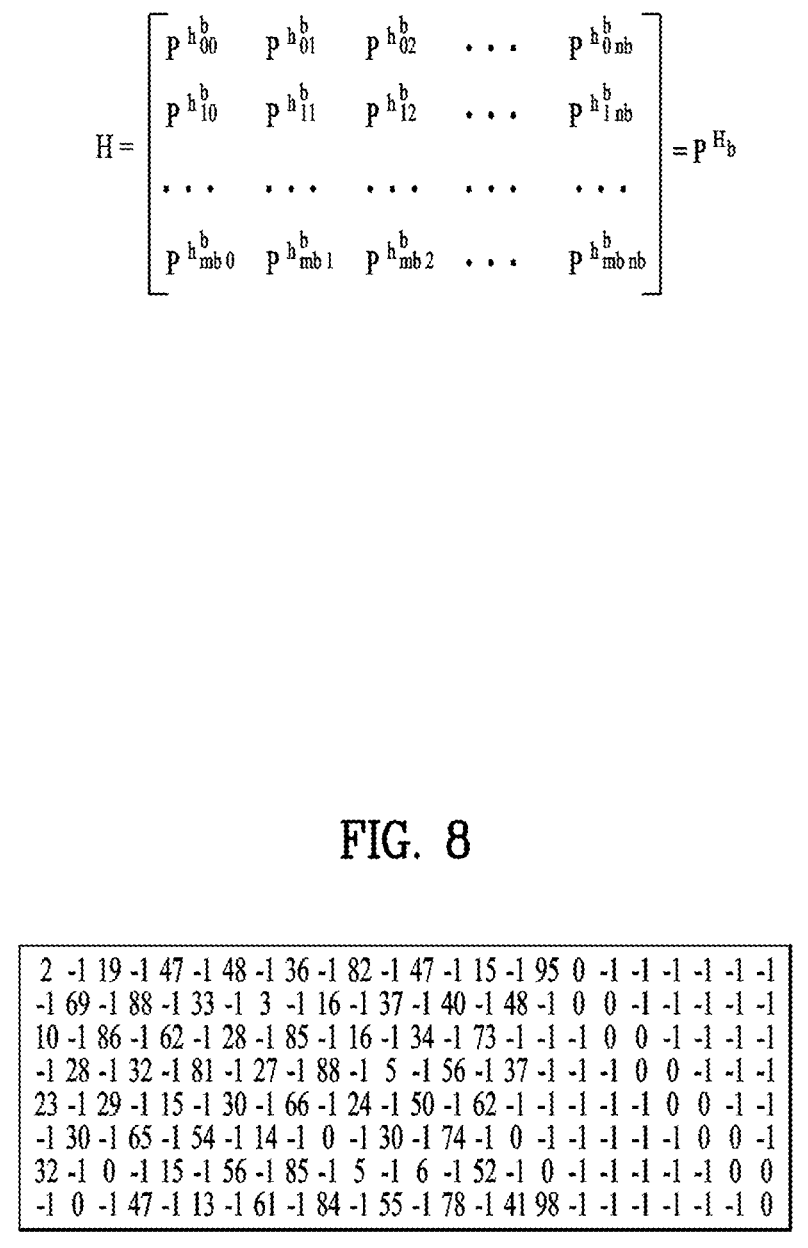

As described previously, the parity check matrix H may be used to generate the LDPC code. The matrix H includes a large number of 0s and a small number of 1s. The size of the matrix H may be $10^5$ bits or more. Many memories may be needed to express the H matrix. In the structured LDPC code, elements of the matrix H may be expressed as sub-blocks of a predetermined size as illustrated in FIG. 7. In FIG. 7, each of the elements of the matrix H represents one subblock.

In the IEEE 802.16e standard specification, a subblock is indicated by one integer index, so that the size of memories for expressing the matrix H may be reduced. Each subblock may be, for example, a permutation matrix of a predetermined size.

FIG. 8 illustrates an exemplary model matrix.

For example, referring to the IEEE 802.16e standard specification, if the size of codewords is 2304 and a code rate 2/3, a model matrix used to encode/decode the LDPC code is as illustrated in FIG. 8. The model matrix may mean a parity check matrix including at least one subblock described below. The subblock may be referred to as the number of shifts in the following description. The model matrix may be extended to the parity check matrix based on a method which will be described later. Therefore, encoding and decoding based on a specific model matrix means encoding and decoding based on a parity check matrix generated by extending the model matrix.

In FIG. 8, index '−1' indicates a zero matrix of a preset size. Index '0' indicates an identity matrix of a preset size. A positive index except for '−1' and '0' indicates the number of shifts. For example, a subblock expressed as index '1' may mean a matrix obtained by shifting an identity matrix once in a specific direction.

Figures 9, 10:
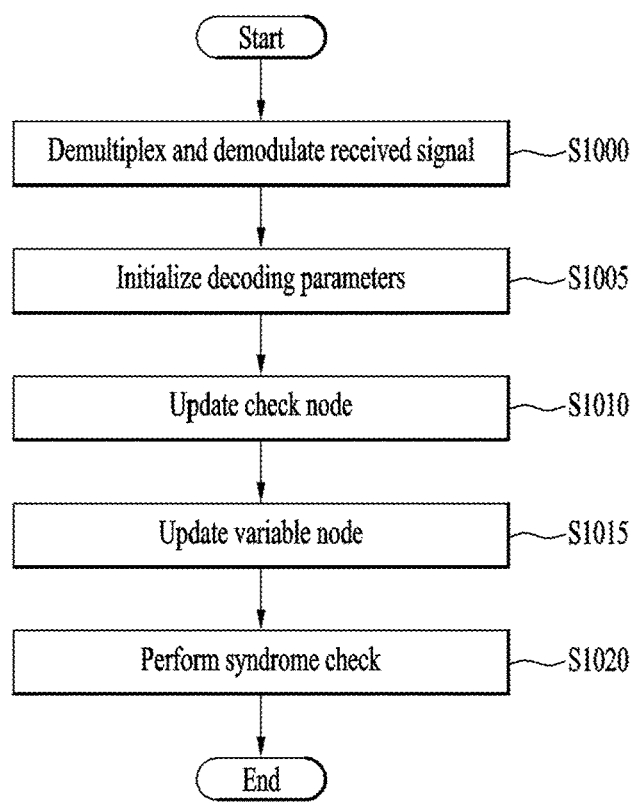
FIG. 9 is a diagram referenced to explain matrix transformation according to the number of shifts.
FIG. 10 is a flowchart illustrating an exemplary LDPC code decoding method.

FIG. 9 is a diagram referenced to explain matrix transformation according to the number of shifts.

For example, FIG. 9 illustrates the case in which the size of a subblock is 4 rows and 4 columns. In FIG. 9, the subblock is shifted from an identity matrix three times to the right. In this case, in a parity check matrix of a structured LDPC code, the subblock may be represented using an integer index of '3'.

Generally, encoding of the LDPC code may be performed by generating a generation matrix G from a parity check matrix H and encoding information bits using the generation matrix. To generate the generation matrix G, Gaussian reduction is performed with respect to the parity check matrix H to configure a matrix in the form of $[P^T:I]$. If the number of the information bits is k and the size of encoded codewords is n, a matrix P is a matrix including k rows and n-k columns and a matrix I is an identity matrix having a size of k.

If the parity check matrix H has the form of $[P^T:I]$, the generation matrix G has a form of $[I:P^T]$. If k information bits are encoded, the encoded information bits may be expressed as a matrix x of one row and k columns. In this case, a codeword c is xG having a form of [x:xP]. Herein, x denotes an information part (or a systematic part) and xP denotes a parity part.

In addition, the information bits may be encoded directly from the matrix H without deriving the matrix G by designing the matrix H as a specific structure without using Gaussian reduction. For the structures of the above-described matrix H and matrix G, the product of the matrix G and a transpose matrix of the matrix H has a value of 0. Using such a characteristic and a relationship between the information bits and the codeword, the codeword may be obtained by adding parity bits to the end of the information bits.

FIG. 10 illustrates an exemplary LDPC code decoding method.

In a communication system, encoded data includes noise in a process of passing through a radio channel. Accordingly, a codeword c is expressed as a codeword c' including noise in a receiver. The receiver performs demultiplexing and demodulation with respect to a received signal (step S1000) and initializes decoding parameters (step S1005). The receiver updates a check node and a variable node (steps S1010 and S1015) and performs syndrome check (step S1020). That is, a decoding procedure may be ended by checking whether $c'H^T$ is 0. If $c'H^T$ is 0, the first k bits from c' may be determined as the information bits x. If $c'H^T$ is not 0, the information bit x may be recovered by searching for c' satisfying the condition that $c'H^T$ is 0 based on a decoding scheme such as a sum-product algorithm.

Figure 11:
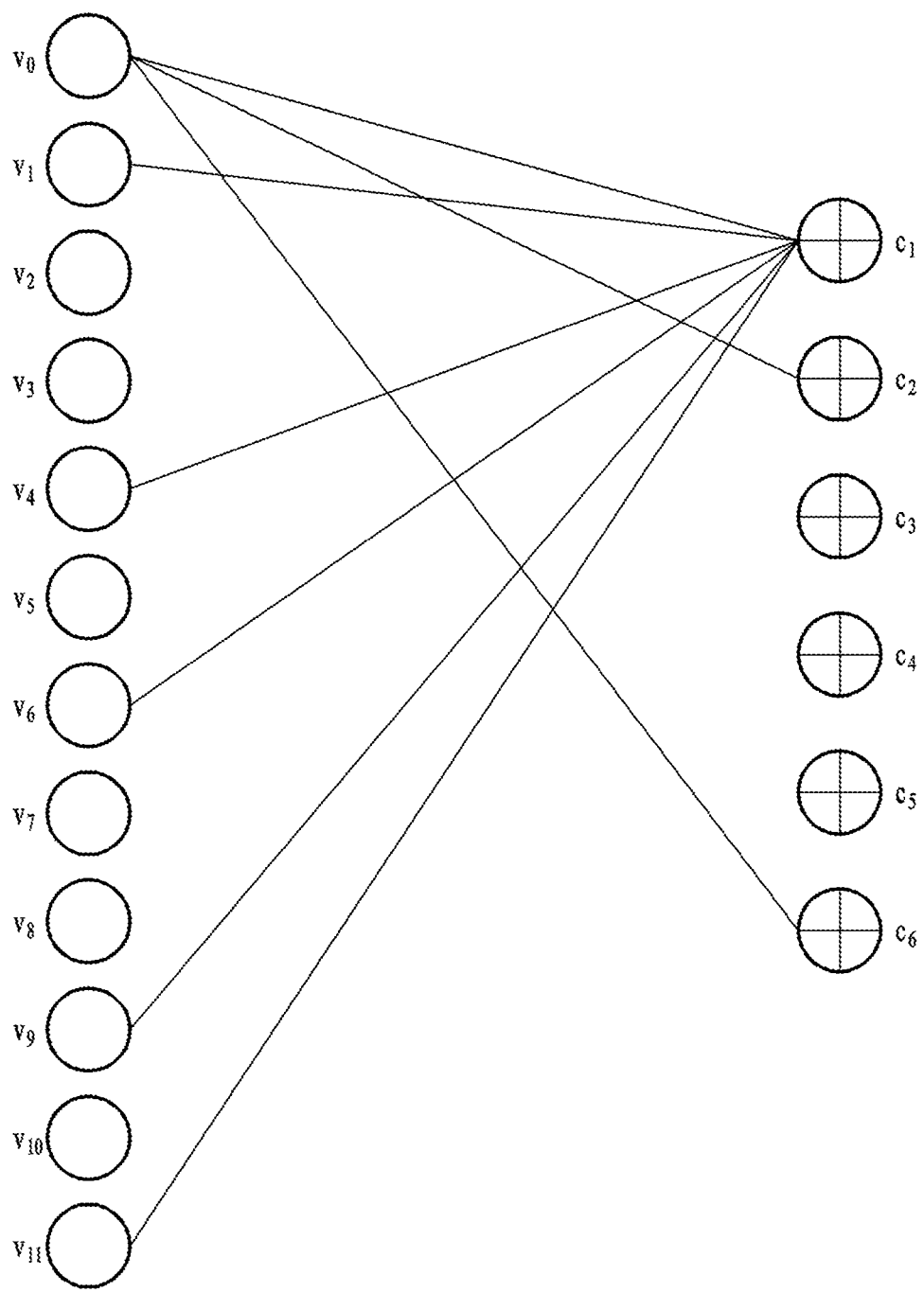
FIG. 11 illustrates an exemplary bipartite graph.

FIG. 11 illustrates an exemplary bipartite graph.

In FIG. 11, left nodes $v_0, v_1, \ldots, v_{11}$ represent variable nodes and right nodes $c_1, c_2, \ldots, c_6$ represent check nodes. In the example of FIG. 11, a bipartite graph is illustrated focusing on the variable node $v_0$ and check node $c_1$ for convenience of description. Connection lines of the bipartite graph of FIG. 11 may be referred to as edges. The bipartite graph of FIG. 11 may be generated from $Hc^t$. Therefore, in FIG. 11, edges from the variable node $v_0$ correspond to the first column of the parity check matrix H and edges from the check node $c_1$ correspond to the first row of the matrix H.

As described above, in order to successfully perform decoding, the product of the parity check matrix H and a transpose matrix of the codeword matrix c should have a value of '0'. Accordingly, values of variable nodes connected to one check node should be 0. Consequently, in FIG. 11, values of exclusive OR (XOR) of the variable nodes $v_0$, $v_1, v_4, v_6, v_9, v_{11}$ connected to the check node $c_1$ should be '0'. Syndrome check means checking as to whether a value of XOR of variable nodes connected to each check node is 0.

Figure 12:
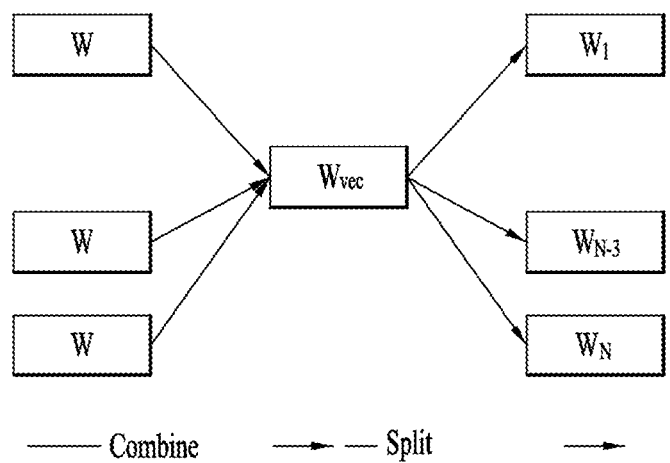
FIG. 12 is an exemplary view illustrating the concept of polar encoding.

FIG. 12 is an exemplary view illustrating the concept of polar encoding.

An encoding procedure of a polar code may include channel combining and channel splitting. As illustrated in FIG. 12, original channels shown on the left side properly combine to generate a vector channel. The generated vector channel is split into new polarized channels as shown on the right side of FIG. 12. Theoretically, the channel capacity of a channel of an infinite length may be classified into channel capacities C(W)=0 and C(W)=1.

Figure 13:
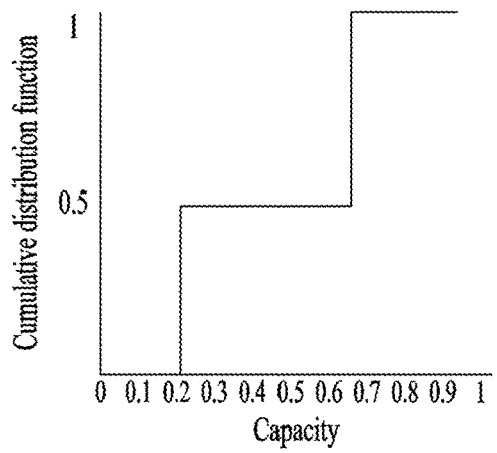
FIG. 13 illustrates polarization tendency according to the length of a code block.
Figure 13:
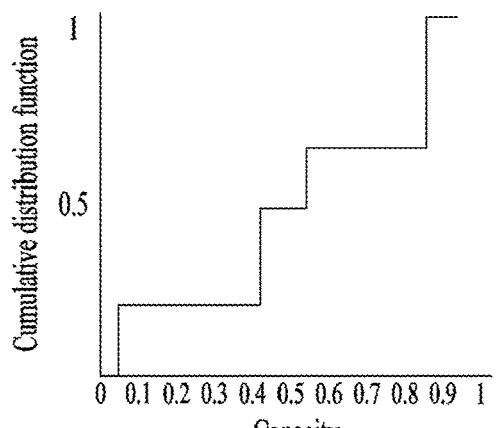
Figure 13:
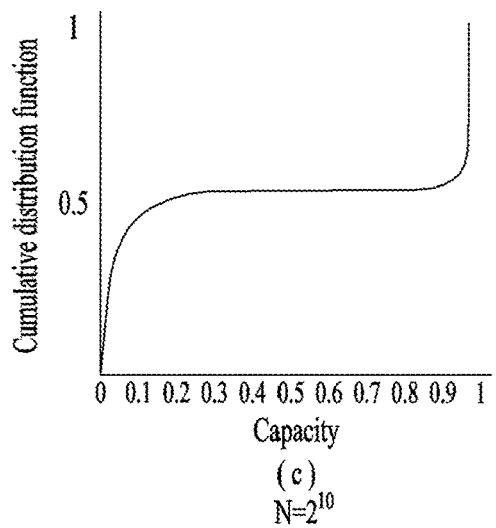

FIG. 13 illustrates polarization tendency according to the length of a code block.

As illustrated in (a) to (c) of FIG. 13, as the length N of the code block increases, a channel capacity is polarized to 1 or 0.

Figure 14:
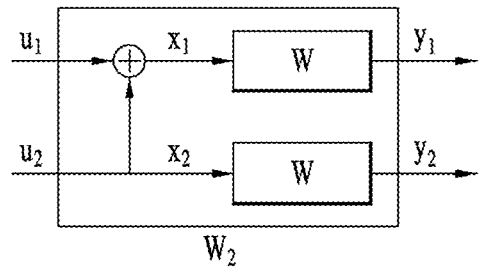
FIG. 14 illustrates a base module of a polar code.

FIG. 14 illustrates a base module of a polar code.

Channel combining described with reference to FIG. 12 may be performed by concatenating binary discrete memoryless channels (B-DMCs) in parallel to determine the size of a code block. In FIG. 14, W denotes a B-DMC. The base module of FIG. 14 combines two B-DMCs. In FIG. 14, $u_1$ and $u_2$ denote binary-input source bits, $x_1$ and $x_2$ denote inputs to the channels W, and $y_1$ and $y_2$ denote output coded bits. In FIG. 14, a channel equivalent to the total channels is denoted by W2. A base matrix F for the base module of FIG. 14 is expressed as Equation 3.

$$F = \begin{bmatrix} 1 & 0 \\ 1 & 1 \end{bmatrix} \quad \text{Equation 3}$$

Although two channels are combined in FIG. 14, N B-DMCs may also be combined. Hereinbelow, N is $2_n$ where n is an integer equal to or greater than 0. When N channels are combined, each of the channels may be represented in a recursive form. For a generator matrix $G_N$, an output $x_1^N$ for an input $u_1^N$ may be expressed as Equation 4.

$$x_1^N = u_1^N G_N \quad \text{Equation 4}$$

In equation 4, $x_1^N = \{x_1, \ldots, x_N\}$ and $u_1^N = \{u_1, \ldots, u_N\}$. The generator matrix $G_N$ may be expressed as Equation 5 using the base matrix F of Equation 3.

$$G_N = B_N F^{\otimes n} \quad \text{Equation 5}$$

where $F^{\otimes M} = F \otimes F^{\otimes(M-1)}$ and $F^{\otimes 0} = 1$. A permutation matrix $B_N$ is expressed as Equation 6.

$$B_N = R_N \begin{bmatrix} B_{N/2} & 0 \\ 0 & B_{N/2} \end{bmatrix} = R_N \left( I_2 \otimes B_{\frac{N}{2}} \right) \quad \text{Equation 6}$$

In Equation 6, $R_N$ represents a bit-reversal interleaver. For an input $(s_1, s_2, \ldots, s_N)$, $R_N$ is defined by Equation 7.

$$(s_1, s_2, \ldots, s_N) R_N = (s_1, s_3, \ldots, s_{N-1}, s_2, s_4, \ldots, s_N) \quad \text{Equation 7}$$

Figure 15:
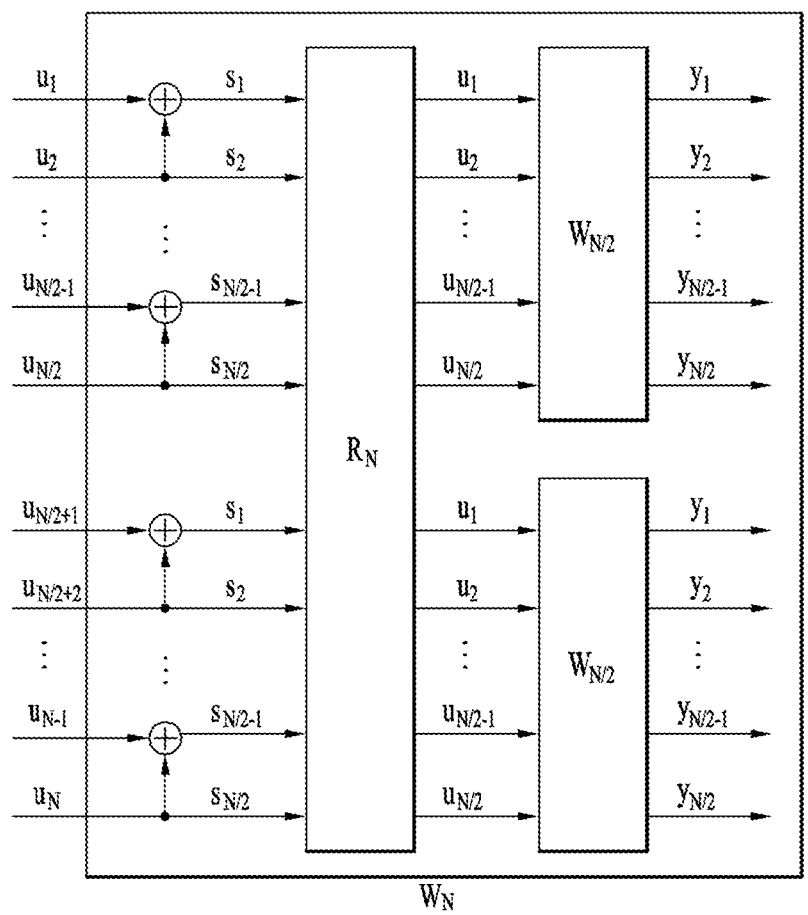
FIG. 15 illustrates exemplary N-level channel combining.

FIG. 15 illustrates exemplary N-level channel combining. The example of FIG. 15 may be expressed as Equation 8.

$$u_1^N W_N = y_1^N \quad \text{Equation 8}$$

Equation 8 may also be expressed as Equation 9 with reference to Equation 3 to Equation 7.

$$u_1^N \left( I_{\frac{N}{2}} \otimes W_2 \right) R_N (I_2 \otimes W_{N/2}) = y_1^N \quad \text{Equation 9}$$

A process of defining a channel equivalent to a specific input after combining the N B-DMCs may be referred to as channel splitting. Among the N channels, an equivalent channel $W_N^{(i)}$ of an i-th channel may be expressed as a channel transmission probability in Equation 10.

$$W_N^{(i)}(y_1^N, u_1^{i-1} | u_i) = \sum_{u_{i+1}^N} \frac{1}{2^{N-1}} W_N(y_1^N | u_1^N) \quad \text{Equation 10}$$

When the above-described channel combining and channel splitting are performed, the following theorem may be obtained. For any B-DMC W, the channel $W_N^{(i)}$ is polarized in the following sense. Among indexes i∈{1, ..., N}, as N goes to infinity, some indexes satisfying $I(W_N^{(i)}) \in (1-\delta, 1]$ becomes I(W) and other indexes satisfying $I(W_N^{(i)}) \in [0, \delta)$ becomes 1−I(W) (where δ∈(0,1)) Therefore, as N goes to infinity, the channel is polarized and thus becomes a completely noisy channel or a noise-free channel. Therefore, a transmitter may transmit data on the noise-free channel.

As described above, if the size N of the code block becomes infinite, an equivalent channel for a specific input bit may be categorized as a noisy channel or a noise-free channel. This means that the capacity of the equivalent channel for the specific input bit is divided into 0 or I(W) which is the capacity of the channel W.

The above-described polar code may be decoded using successive cancellation (SC) decoding. The SC decoding scheme may be performed by calculating a channel transition probability and calculating a likelihood ratio (LLR) of an input bit using the calculated probability. In this case, the channel transmission probability may be calculated recursively using a characteristic in which channel combining and channel splitting are configured in a recursive form. Therefore, the LLR may also be calculated recursively.

The channel transition probability $W_N^{(i)}(y_1^N, u_1^{i-1} | u_i)$ may be expressed as Equation 11. In Equation 11, an input bit $u_1^i$ is separately represented as an odd-numbered index $u_{1,o}^i$ and an even-numbered index $u_{1,e}^i$.

$$W_{2N}^{(2i-1)}(y_1^{2N}, u_1^{2i-2} | u_{2i-1}) = \sum_{u_{2i}^{2N}} \frac{1}{2^{2N-1}} W_{2N}(y_1^{2N} | u_1^{2N}) = $$

$$\sum_{u_{2i,o}^{2N}, u_{2i,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N}) = $$

$$\sum_{u_{2i}} \frac{1}{2} \sum_{u_{2i+1,e}^{2N}} \frac{1}{2^{N-1}} W_N(y_{N+1}^{2N} | u_{1,e}^{2N})$$

$$\sum_{u_{2i+1,o}^{2N}} \frac{1}{2^{N-1}} W_N(y_1^N | u_{1,o}^{2N} \oplus u_{1,e}^{2N}) = $$

$$\sum_{u_{2i}} \frac{1}{2} W_N(y_1^N, u_{1,o}^{2i-2} \oplus u_{1,e}^{2i-2} | u_{2i-1} \oplus u_{2i})$$

$$W_N^{(i)}(y_{N+1}^{2N}, u_{1,e}^{2i-2} | u_{2i}) \quad \text{Equation 11}$$

Equation 10 may be summarized as Equation 12.

$$W_N^{(i)}(y_1^N, u_1^{i-1} | u_i) = \sum_{u_{i+1}^N} \frac{1}{2^{N-1}} W_N(y_1^N | u_1^N) = $$

$$\sum_{u_{2i+1,o}^{2N}, u_{2i+1,e}^{2N}} \frac{1}{2^{2N-1}} W_N(y_1^N | u_{1,o}^{2N} \oplus u_{1,e}^{2N})$$

$$W_N(y_{N+1}^{2N} | u_{1,e}^{2N}) = \frac{1}{2} \sum_{u_{2i+1,e}^{2N}} \frac{1}{2^{N-1}} W_N(y_{N+1}^{2N} | u_{1,e}^{2N})$$

$$\sum_{u_{2i+1,o}^{2N}} \frac{1}{2^{N-1}} W_N(y_1^N | u_{1,o}^{2N} \oplus u_{1,e}^{2N}) \quad \text{Equation 12}$$

Accordingly, the LLR $$L_N^{(i)} = \frac{W_N^{(i)}(y_1^N, \hat{u}_1^{i-1} \mid 0)}{W_N^{(i)}(y_1^N, \hat{u}_1^{i-1} \mid 1)}$$

may be calculated by Equation 13 and Equation 14.

$$L_N^{(2i-1)}(y_1^N, \hat{u}_1^{2i-1}) = \qquad \text{Equation 13}$$

$$\frac{L_{\frac{N}{2}}^{(i)}\left(y_1^{\frac{N}{2}}, \hat{u}_{1,o}^{2i-2} \oplus \hat{u}_{1,e}^{2i-2}\right) L_{\frac{N}{2}}^{(i)}\left(Y_{\frac{N}{2}+1}^N, \hat{u}_{1,e}^{2i-2}\right) + 1}{L_{\frac{N}{2}}^{(i)}\left(y_1^{\frac{N}{2}}, \hat{u}_{1,o}^{2i-2} \oplus \hat{u}_{1,e}^{2i-2}\right) + L_{\frac{N}{2}}^{(i)}\left(y_{\frac{N}{2}+1}^N, \hat{u}_{1,e}^{2i-2}\right)}$$

$$L_N^{(2i)}(y_1^N, \hat{u}_1^{2i-1}) = \qquad \text{Equation 14}$$

$$\left[L_{\frac{N}{2}}^{(i)}\left(y_1^{\frac{N}{2}}, \hat{u}_{1,o}^{2i-2} \oplus \hat{u}_{1,e}^{2i-2}\right)\right]^{1-2\hat{u}_{2i-1}} L_{\frac{N}{2}}^{(i)}\left(y_{\frac{N}{2}+1}^N, \hat{u}_{1,e}^{2i-2}\right)$$

The complexity of a polar encoder and an SC decoder varies with the length N of a code block and is known as O(N log N).

Assuming that a K-bit input is used for a polar code with a code block length of N, a coding rate is N/K. In this case, if a generator matrix for a polar encoder with a data payload length of N is $G_N$, coded bits may be represented as an equation $x_1^N = u_1^N G_N$. Among the input bits $u_1^N = \{u_1, \ldots, u_N\}$, K bits are payload bits. It is assumed that row indexes of the generator matrix $G_N$ corresponding to the payload bits, are I. In this case, a minimum distance $d_{min}(C)$ of a polar code may be expressed as Equation 15.

$$d_{min}(C) = \min_{i \in I} 2^{wt(i)} \qquad \text{Equation 15}$$

In Equation 15, wt(i) is a number within binary expansion of i (where i=0, 1, . . . , N−1).

In the following description, payload bits for transmitting data may be referred to as data bits and bits except for the payload bits (i.e., bits through which data is not actually transmitted) may be referred to as frozen bits. A polar code has an issue about whether a bit of any location in a code block is determined to be a data bit or a frozen bit. For example, the data bit and the frozen bit may be determined based on the channel capacity of each channel. However, the channel capacity is a theoretical limit using mutual information and, thus, in actual implementation, it is difficult to determine the data bit or the frozen bit based on the channel capacity. Therefore, hereinbelow, a method of independently determining the data bit and/or the frozen bit based on an information block size without using the channel capacity will be described.

Retransmission of an incremental redundancy (IR) type represents that a retransmitted packet includes new information from a previously transmitted packet. Generally, retransmission further includes an additional parity bit. A receiver may attempt to recover data by combining retransmitted data with previously received data. For retransmission of the IR type, a bit-reversal scheme or an incremental freezing scheme may be used.

Figure 16:
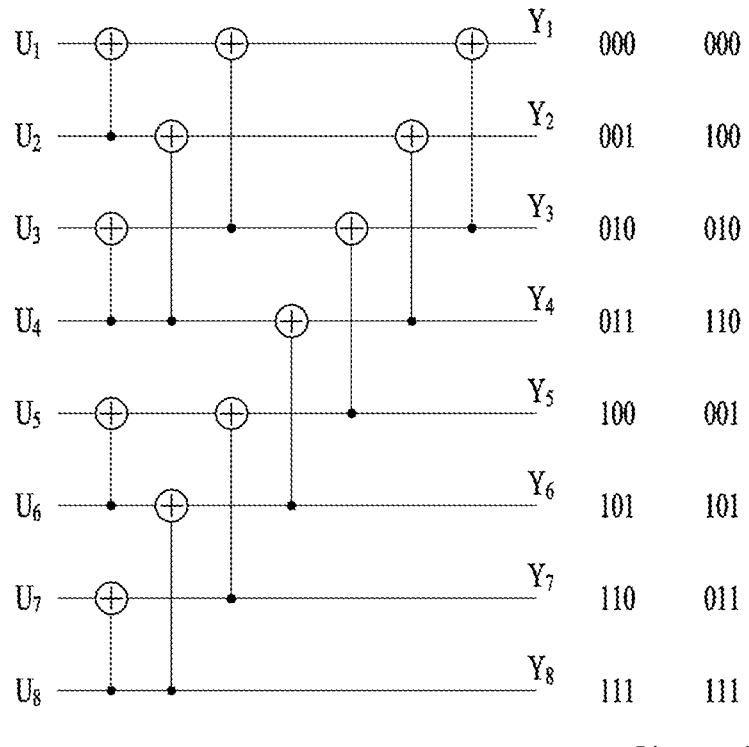
FIG. 16 illustrates an exemplary bit-reversal scheme.

FIG. 16 illustrates an exemplary bit-reversal scheme.

In FIG. 16, 2 bits are punctured. In the bit-reversal scheme, puncturing is performed with respect to output bits. Particularly, puncturing is performed in bit-reversal order. In this case, output bits $y_1$ and $y_6$ may be punctured. However, for example, some input bits $u_1$, $u_2$, $u_3$, and $u_5$ may be determined to be frozen bits. In the polar code, an information bit has an unequal error protection (UEP) characteristic due to a channel polarization effect. In addition, since output bits are punctured in the bit-reversal scheme, it is difficult to calculate a variation of a channel capacity due to puncturing. Accordingly, it is not easy to determine a bit to be retransmitted and a puncturing pattern based on the channel capacity.

Figure 17:
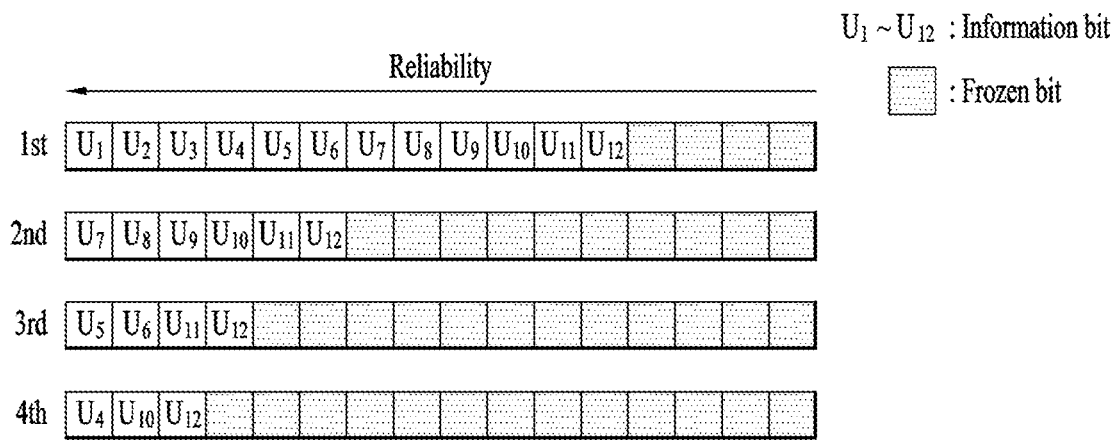
FIG. 17 illustrates an exemplary incremental freezing scheme.

FIG. 17 illustrates an exemplary incremental freezing scheme.

In the incremental freezing scheme, the ratio of frozen bits in retransmission increases as the number of retransmissions increases. In addition, in the incremental freezing scheme, retransmission is performed starting from data having high unreliability. For example, data with a length of N and a code rate of R of an output bit may be transmitted in first transmission. That is, the size of information bits in first transmission is R*N. In L-th transmission, data with a length of N and a code rate of R/L, of an output bit may be transmitted. For example, as illustrated in FIG. 17, each transmission has a predetermined size but has a reduced code rate. Hence, in the incremental freezing scheme, as retransmission is repeated, the size of retransmitted data is maintained but the size of information bits in the data decreases. Therefore, signaling overhead may increase because data of a predetermined size should always be transmitted even during retransmission.

For example, a shortening scheme may be used to reduce signaling overhead. The shortening scheme may provide flexibility of an information block size. For example, if an information size is determined as in an LDPC code or a polar code, '0' may be used with respect to information bits corresponding to the reduced length according to the shortening scheme. When a code rate is R, output bits corresponding to s/R may be punctured for the code rate. As described above, since the polar code has the UEP characteristic, the shortening scheme may be applied based on locations of frozen bits. For example, shortening bits and frozen bits may be simultaneously changed. However, in this case, complexity may increase due to change in the locations of the frozen bits.

Accordingly, an improved shortening scheme is needed to support flexibility for information block size. Hereinafter, the improved shortening scheme will be described. In addition, a method supporting IR type hybrid automatic repeat request (HARM) using the shortening scheme is described. In the following description, the structure of an encoder will be described focusing on $F^{\otimes n}$ instead of the generator matrix $G_N$ with reference to Equation 5 described above. The permutation matrix $B_N$ simply changes only the locations of input bits. More specifically, although input bit locations vary according to whether the permutation matrix is applied, a combination of the input bits in output bits is not changed and only the locations of the output bits are changed. Therefore, in the following embodiments, the permutation matrix may be described as being applied to coarse input bits.

Figure 18:
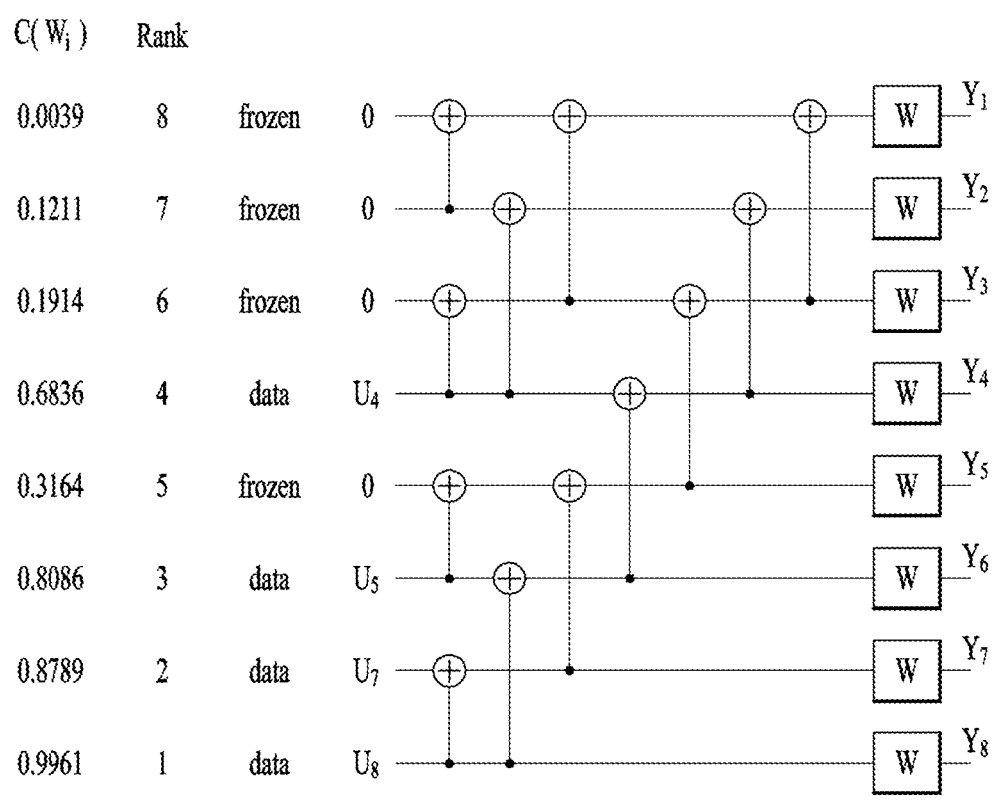

FIG. 18 illustrates exemplary determination of bit bits and frozen bits.

In FIG. 18, the locations of data bits and frozen bits are determined in ascending order of channel capacity. The locations of the data bits are determined in consideration of a code rate in ascending order of channel capacity. FIG. 18 illustrates exemplary location determination of data bits and frozen bits of a polar code with a code rate of ½ and a channel length of N=8 with respect to a binary erasure channel (BEC) having an erasure rate of 0.5. In FIG. 18, 4 locations having a high channel capacity $C(W_i)$ are the data bits and the other bits are determined to be the frozen bits.

A channel capacity C(W) is defined by Equation 16 and indicates the amount of information between transmission data X and reception data Y.

$$C(W) \triangleq I(X;Y) \qquad \text{Equation 16}$$

That is, Equation 16 may represent the ratio of transmitted data to received data. The transmitted data corresponds to encoded symbols passing through an encoder. The channel capacity may be determined according to the ratio of information bits that a transmitter desires to transmit in received coded symbols. Therefore, if the ratio of information bits in the encoded symbols is low, this implies that the channel capacity is low.

Referring back to FIG. 14, the base module of the polar code has a characteristic indicated by the following equation.

$$C(W_{u1}) \leq C(W_2) \leq C(W_{u2}) \qquad \text{Equation 17}$$

In the above equation, $C(W_2)$ represents an entire channel capacity of the base module. $C(W_{u1})$ represents a channel capacity between an input $u_1$ and outputs $y_1$ and $y_2$ and $C(W_{u2})$ represents a channel capacity between an input $u_2$ and the outputs $y_1$ and $y_2$.

As described above, since the polar code encoder is in the form of the Kronecker product with respect to the base module, the characteristic of Equation 17 is maintained even if the channel length of N increases. Hence, it may be assumed based on Equation 17 that the channel capacity of an upper half input for the polar code module is greater than the channel capacity of a lower half input for the polar code module. Accordingly, a weight may be determined based on a channel capacity. For example, referring to FIG. 14, a weight of the input $u_1$ may be determined to be 1 and a weight of the input $u_2$ may be determined to be 2.

Figure 19A:
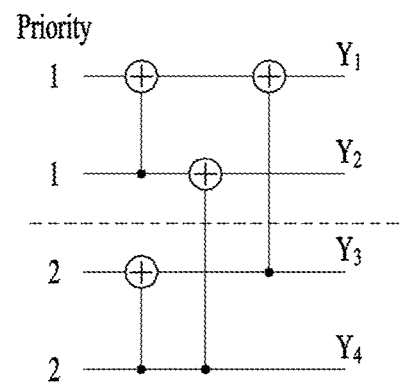
FIG. 19A illustrates a polar code module with a channel length of 4.

FIG. 19A illustrates a polar code module with a channel length of 4.

As described above, a weight of a channel for an upper half input of the polar code module may be configured as 1 and a weight of a channel for a lower half input of the polar code module may be configured as 2.

Figure 19B:
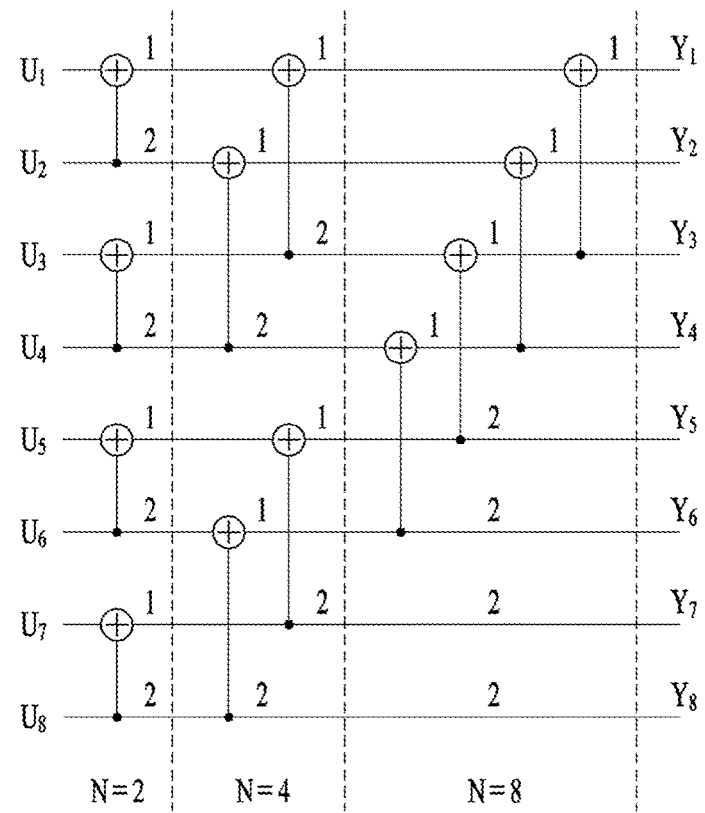
FIG. 19B illustrates a polar code module with a channel length of 8.

FIG. 19B illustrates a polar code module with a channel length of 8.

In FIG. 19B, weights of respective channels are represented when a channel length is 8 based on the above description. A weight for each stage when a channel length N is 2, 4, or 8 is represented as number 1 or 2. The sum of weights of channels for each input bit to a coded bit is shown in Table 1.

TABLE 1

| input bit | N = 2 | N = 4 | N = 8 | Sum |
|---|---|---|---|---|
| $U_1$ | 1 | 1 | 1 | 3 |
| $U_2$ | 2 | 1 | 1 | 4 |
| $U_3$ | 1 | 2 | 1 | 4 |
| $U_4$ | 2 | 2 | 1 | 5 |
| $U_5$ | 1 | 1 | 2 | 4 |
| $U_6$ | 2 | 1 | 2 | 5 |
| $U_7$ | 1 | 2 | 2 | 5 |
| $U_8$ | 2 | 2 | 2 | 6 |

In Table 1, $U_4$, $U_6$, and $U_7$ the same value as the sum of weights. That is, this implies that the same amount of input bits of $U_4$, $U_6$, and $U_7$ are included in coded bits.

Figure 20:
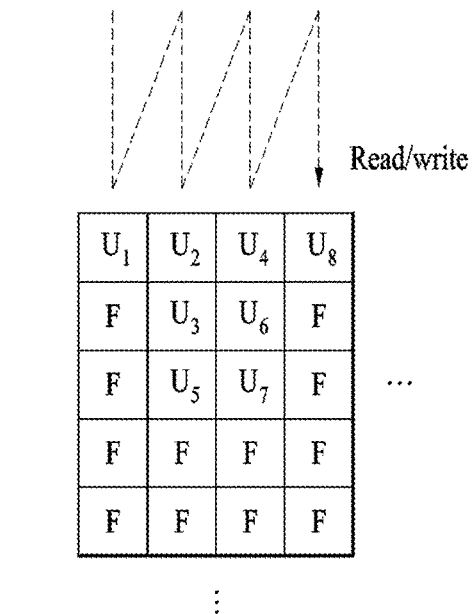
FIG. 20 illustrates an exemplary memory configuration.

FIG. 20 illustrates an exemplary memory configuration.

In FIG. 20, a memory may be configured according to Table 1. The memory configuration of FIG. 20 illustrates an exemplary configuration and may be a part of the memory. The memory configuration of FIG. 20 may be used to store order (or priority) of the location of each input bit. After mapping of data to input bits is ended, frozen bits may be mapped to the other locations of the memory. While the memory is read, the memory may be read in the same order as writing. For example, order of input bits may be represented as $\{U_1, U_2, U_3, U_5, U_4, U_6, U_7, U_8\}$. In this embodiment, channel capacities may be determined similarly to the example of FIG. 18 considering channel capacities. That is, in this embodiment, $U_1$, $U_2$, $U_3$, and $U_5$ have low weights relative to the other bits. Even in the example of FIG. 18, input bits of the corresponding locations have relatively low channel capacities.

Figure 21:
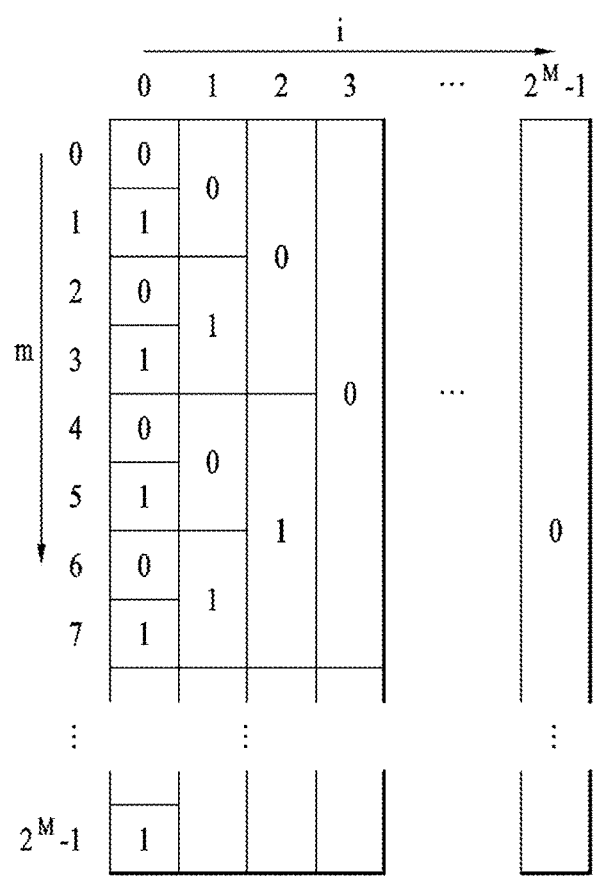
FIG. 21 is a view for explaining an exemplary memory configuration based on priority.

FIG. 21 is a view for explaining an exemplary memory configuration based on priority.

Referring to FIG. 19A, an upper part of a unit blot in each stage has a low weight and a lower part has a high weight. In the embodiment of FIG. 21, a low weight is configured as 0 and a high weight is configured as 1. Each block denotes a weight in a corresponding stage. In this embodiment, a channel has a size of $2^M$. An index m of an input bit has a value from 0 to $2^M-1$.

Referring to FIG. 21, a weight of each input bit m may be calculated by computing a weight of an input bit for each stage. For example, a weight $k_m$ for the input bit m may be determined according to the following equation.

$$k_m = \sum_{i=0}^{M-1} \lfloor (m \bmod 2^{i+1})/2^i \rfloor \qquad \text{Equation 18}$$

That is, a weight is calculated by adding weights for respective stages i. In addition, a weight in each stage i may be calculated by performing modulo operation for an index of an input bit by $2^{i+1}$, dividing a resultant value of the module operation by $2^i$, and then flooring a corresponding value.

According to the calculated weight, input bit indexes may be written to columns of a corresponding memory in ascending order of the input bit indexes.

Priority of each input bit may be determined based on the above-described weight. An input bit having a high weight may have a high priority. A data bit and a frozen bit among input bits may be determined based on priority of the input bit. Even when the size of a channel is changed, the priority of the input bit may be dynamically determined using the above-described method. In addition, the frozen bit and the dynamic data bit may be dynamically determined.

A method of determining priority of each input bit has been described hereinabove. Hereinbelow, a method of providing flexibility of an information block size will be described.

For example, increase of the number of frozen bits and puncturing may be simultaneously performed. Similarly to rate matching of the technical standard of IEEE 802.11n, data bits corresponding to a shortening length may be changed to frozen bits. For example, when 2 bits are shortened, 2 data bits may be changed to frozen bits. The frozen bits may be known bits which are known to a transmitter and a receiver.

When data bits are changed to frozen bits, the data bits to be changed may be determined based on priority of the data bits. Priority may be determined based on priority of input bits. Priority may be preconfigured based on the structure of an encoder and/or the size of a channel. For example, bits having a low priority among data bits may be changed to frozen bits.

After data bits are changed to frozen bits, encoding based on the polar code may be performed. Next, a target code rate may be achieved by performing puncturing coded bits. The punctured bits may be configured as having an LLR value of 0 during decoding.

Figure 22:
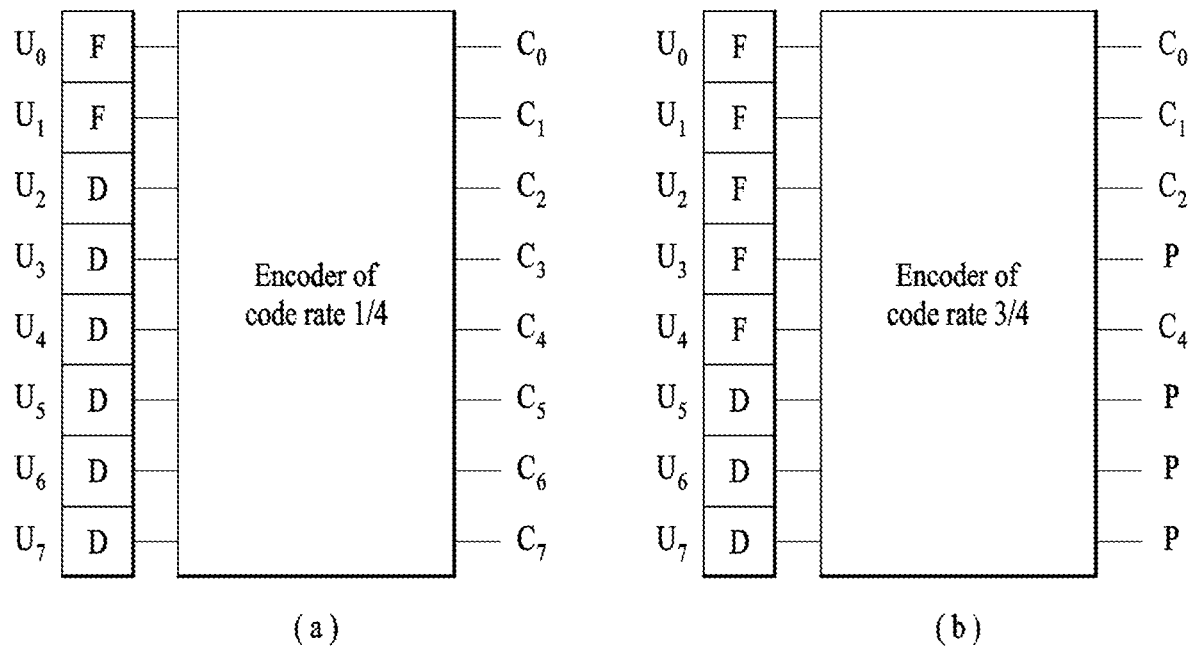
FIG. 22 illustrates an exemplary shortening scheme.

FIG. 22 illustrates an exemplary shortening scheme.

FIG. 22 illustrates a shortening scheme of an encoder with a code rate of ¾. In the example of FIG. 22, the encoder has a channel size of 8. In the example of FIG. 22, D denotes a data bit and F denotes a frozen bit. For example, the frozen bit may have a value of 0. P denotes a puncturing bit. $U_0$ to $U_7$ denote input bits and $c_0$ to $c_7$ denote coded bits.

In (a) of FIG. 22, for example, the input bits $U_1$, and $U_2$ are configured as frozen bits. Referring to (b) of FIG. 22, 3-bit shortening is applied. In this case, input bits $U_2$, $U_3$, and $U_4$ having a low priority among data bits are replaced with frozen bits. To maintain a code rate, the coded bits $c_3$, $c_5$, $c_6$, and $c_7$ are punctured. According to an arbitrary pattern, coded bits may be punctured. For example, puncturing bits may be randomly selected or may be preset.

Figure 23:
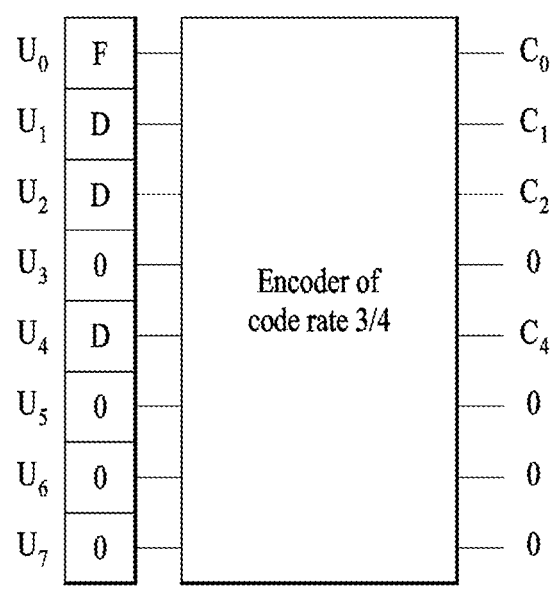
FIG. 23 illustrates a shortening scheme according to another embodiment.

FIG. 23 illustrates a shortening scheme according to another embodiment.

FIG. 23 illustrates an encoder to which the shortening scheme is applied from (a) of FIG. 22. For example, when n (where n is an integer equal to or larger than 1) bits are shortened, n/R data bits are changed to shortening bits '0' in order to maintain a code rate. Herein, R is a code rate. A shortening bit may be referred to as a frozen bit or a known bit. In the present embodiment, data bits replaced with the shortening bits may be determined based on priority. For example, bits starting from a data bit having a high priority may be replaced with the shortening bits. For example, as a channel capacity increases, a high priority may be configured. A priority may be preconfigured or may be configured as described above.

Referring back to FIG. 14, due to a structural characteristic of the base module of the polar code, a lower input is output through a channel as an original state thereof. Therefore, in FIG. 23, coded bits of the same position as shortening bits have a value of '0'. The size of an output caused by the shortening bits becomes n/R. Hence, these bits are not transmitted. In the receiver, it may be assumed that an LLR of a coded bit which is not transmitted has an infinite value.

In addition, since the size of output bits is changed, frozen bits may be changed. In this case, frozen bits starting from a frozen bit having a high priority may be changed to data bits. The number of frozen bits changed to the frozen bits is n/R-n. A preconfigured priority or a priority determined by the above method may be used.

As described above, when a data bit having a high priority is shortened, a priority configured before shortening may be used in spite of shortening. Therefore, there is no need to additionally recalculate priority with respect to an input length after shortening.

Accordingly, in the present embodiment, when n bits are shortened, data bits corresponding to n/R bits are replaced with shortening bits and frozen bits corresponding to n/R-n bits are changed to data bits. In addition, coded bits of the same locations as the shortened bits are not transmitted.

Referring to FIG. 23, 3-bit shortening of a code rate of ¾ is performed. To this end, 4 data bits $U_3$, $U_5$, $U_6$, and $U_7$ having a high priority are replaced with shortening bits. The shortening bits are denoted by '0' and may be substantially the same as frozen bits. Next, one frozen bit $U_1$ having a high priority is changed to a data bit. Encoding based on the polar code is performed and then the remaining bits except for the coded bits corresponding to the shortening bits may be transmitted.

Hereinabove, a priority determination method and a shortening scheme for input bits have been described. Hereinbelow, an IR HARQ method will be described.

The polar code has different channel capacities for respective information bits. That is, the polar code has a different UEP characteristic having different reliability for each input bit. Therefore, unlike a turbo code, retransmission of the polar code needs to be performed based on reliability. To improve reliability, demanded information bits need to be retransmitted. In addition, to support IR HARQ, it is necessary to generate a parity different from a pre-transmitted parity.

For example, retransmission may be performed based on priority in order to improve reliability. For example, retransmission may be performed in descending order of priority among data bits. In this case, a shortening scheme may be applied to the remaining bits except for retransmitted bits. For example, the above-described shortening scheme may be applied to maintain a code rate. For example, the shortening scheme may be applied to bits of length obtained by subtracting the length of data bits to be retransmitted from the length of the data bits. According to the above-described shortening scheme, the length of shortening bits may be determined by dividing the length of bits except for the retransmitted bits from the data bits by a code rate. Therefore, unlike an incremental freezing scheme, the length of transmitted coded bits is adjusted according to the code rate.

Figure 24:
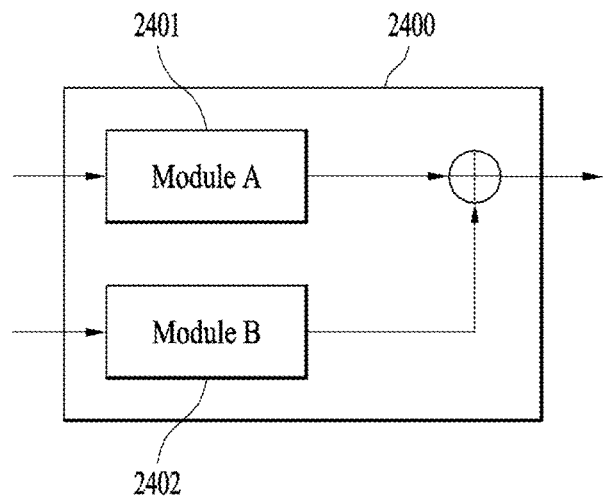
FIG. 24 illustrates the configuration of an encode module according to an embodiment

FIG. 24 illustrates the configuration of an encode module according to an embodiment.

An encoder module 2400 of FIG. 24 includes two encoder modules, i.e., a module A 2401 and a module B 2402. The module A 2401 and the module B 2402 may be encodes having the same channel length. An XOR operation for outputs from the module A 2401 and the module B 2402 is performed so that an output of the encoder module 2400 is generated. The encoder 2400 of FIG. 24 may support IR HARQ.

The module A 2401 is a polar code encoder for first transmission and the module B 2402 is a polar code encoder for retransmission. For example, the module B 2402 may be used by copying data of the module A 2401. For example, data bit/frozen bit determination and priority used by the module A 2401 may be used for the module B 2402. In addition, according to increase in the number of retransmissions, a module for retransmission may be repeatedly added.

That is, while one retransmission module B 2402 is illustrated in FIG. 24, a retransmission module for each retransmission may be extended and added. Therefore, independent decoding may be performed with respect to each module at each retransmission timing.

As described above, the polar code has a UEP characteristic. Therefore, it is necessary to determine data bits for retransmission starting from third transmission (i.e., second retransmission). For example, as illustrated in FIG. 18, data bits may have channel capacities of 0.5 or more. In a normal case, there is a high probability that the data bits have channel capacities of 0.5 or more. Hence, when a data bit having lowest reliability among the data bits is retransmitted, higher reliability may be obtained relative to retransmission of a data bit having highest reliability. Accordingly, in the present embodiment, data bits may be retransmitted in descending order of reliability. Reliability may be determined based on the above-described channel capacity, priority, or weight.

In the above-described retransmission method, even if a data bit having low reliability is retransmitted, reliability higher than retransmission of a data bit having high reliability may not be obtained. However, the limited number of retransmissions is generally used and there is a low possibility that reliability of a retransmitted data bit is lower than reliability of a data bit which is not retransmitted. In addition, as the length of a channel increases, channel polarization increases. Hence, as channel length increases, a difference in reliability between data bits decreases. In this case, a probability that reliability of the retransmitted data bit is lower than reliability of the data bit which is not retransmitted may be further reduced.

Hereinafter, a retransmission scheme of the polar code will be described.

As described above, retransmission may be performed in descending order of priority among data bits. Hereinbelow, retransmission will be described focusing on the case in which a channel length is 8.

Figure 25:
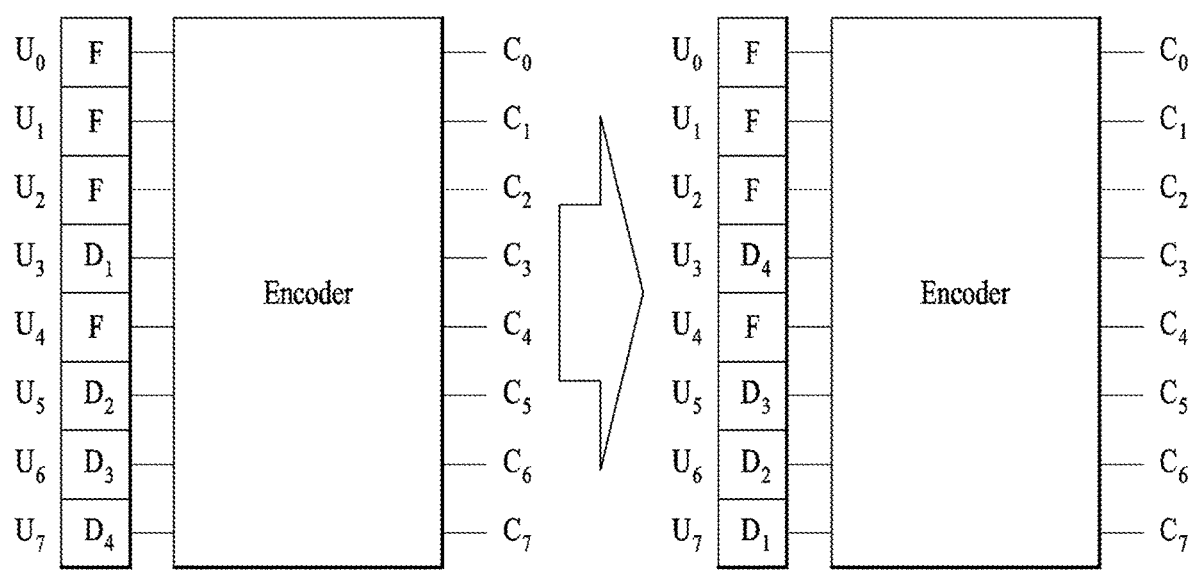
FIG. 25 illustrates retransmission according to a first example.

FIG. 25 illustrates retransmission according to a first example.

In the first example, all data may be retransmitted. Referring to FIG. 25, in first transmission of the left side, data bits $D_1$, $D_2$, $D_3$, and $D_4$ are mapped to input bits $U_3$, $U_5$, $U_6$, and $U_7$, respectively. The mapped data bits and frozen bits F are encoded through an encoder. In second transmission of the right side, the data bits are mapped to the input bits in reverse order. That is, the data bits $D_4$, $D_3$, $D_2$, and $D_1$ are mapped to the input bits $U_3$, $U_5$, $U_6$, and $U_7$, respectively. The mapped data bits and frozen bits are encoded through an encoder. In third transmission, the data bits of second transmission may be mapped in reverse order. In every transmission, the data bits of previous transmission may be mapped in reverse order. The positions of the frozen bits may be mapped in every transmission.

Figure 26:
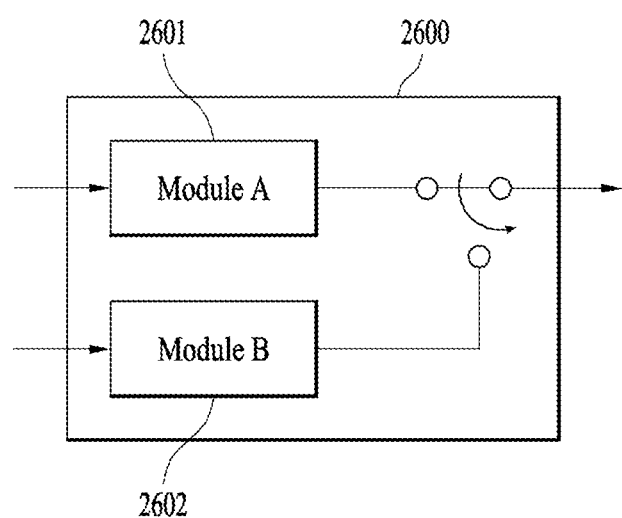
FIG. 26 illustrates an encoder module for retransmission according to a second example.

FIG. 26 illustrates an encoder module for retransmission according to a second example.

Retransmission of a data bit having low reliability is identical to applying a shortening scheme to the data bit. To maintain a code rate, the above-described shortening scheme for IR HARQ may be applied. That is, according to the above-described shortening scheme, the length of shortening bits may be determined by dividing the length of bits except for retransmitted bits from data bits by the code rate. Therefore, unlike the incremental freezing scheme, the length of transmitted coded bits may be adjusted according to the code rate.

An encoder 2600 may include a module A 2601 and a module B 2602. The module A 2601 may be used for first transmission and the module B 2602 may be used for retransmission. That is, a retransmission module is added to an existing polar code encoding module and the shortening scheme may be applied to the retransmission module. In this case, the retransmission module B 2602 may be a copy of the module A 2601 used for first transmission. For example, data bit/frozen bit determination and priority used in the module A 2601 may also be used in the module B 2602. As the number of retransmissions increases, the module for retransmission may be repeatedly added.

Figure 27:
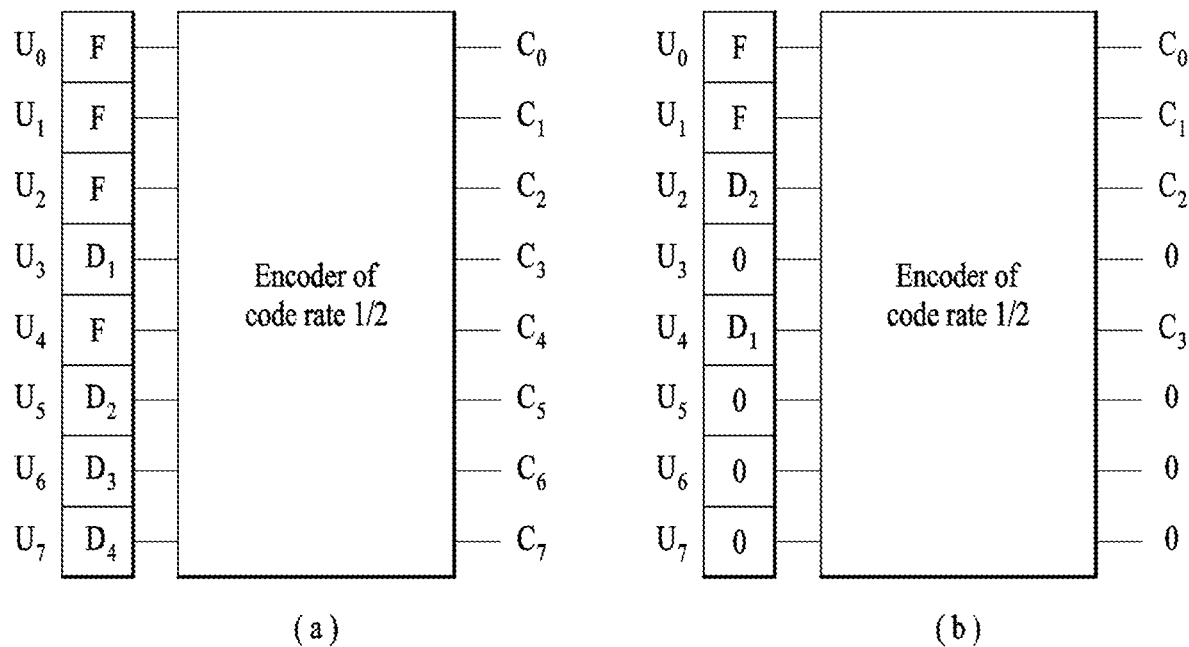
FIG. 27 illustrates a retransmission scheme according to a second example.
Figure 27:
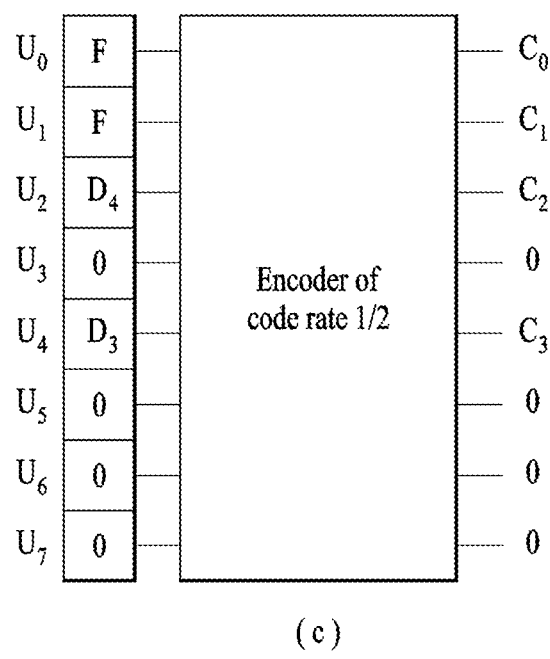

FIG. 27 illustrates a retransmission scheme according to a second example.

In FIG. 27, data bits $D_1$, $D_2$, $D_3$, and $D_4$ or frozen bits F are mapped to input bits. An encoder with a code rate of ½ encodes the input bits to coded bits $c_0$, $c_1$, $c_2$, $c_3$, $c_4$, $c_5$, $c_6$, and $c_7$. The frozen bits and the data bits are determined based on priority described above. In FIG. 27, shortening bits are denoted by 0. In an output stage, '0' means a bit which is not transmitted.

In first transmission of (a) of FIG. 27, data bits $D_1$, $D_2$, $D_3$, and $D_4$ are mapped to input bits $U_3$, $U_5$, $U_6$, and $U_7$, respectively. In this embodiment, 4-bit shortening is applied to retransmission. That is, two data bits are retransmitted in consideration of the code rate. Therefore, the length 4 of shortening bits may be determined by subtracting the length 2 of retransmitted bits from the length 4 of data bits of first transmission and then dividing the subtracted result by the code rate of ½. Hence, in (b) of FIG. 27, data bits having a high priority among the data bits are replaced with the shortening bits. In addition, the positions of input bits to which data bits are to be mapped may be determined based on priority of the remaining data bits and frozen bits. That is, data bits may be sequentially mapped to the remaining input bits in ascending order of priority. For example, in FIG. 27, all data bits of first transmission are shortened in retransmission. Hence, data bits are sequentially mapped in ascending order priority of the remaining frozen bits. In first retransmission ((b) of FIG. 27), data bit $D_1$ is mapped to input bit $U_4$ and data bit $D_2$ is mapped to input bit $U_2$. After encoding, coded bits corresponding to positions of shortening bits are not transmitted. In second retransmission ((c) of FIG. 27), data bit $D_3$ is mapped to input bit $U_4$ and data bit $D_4$ is mapped to input bit $U_2$.

Figure 28:
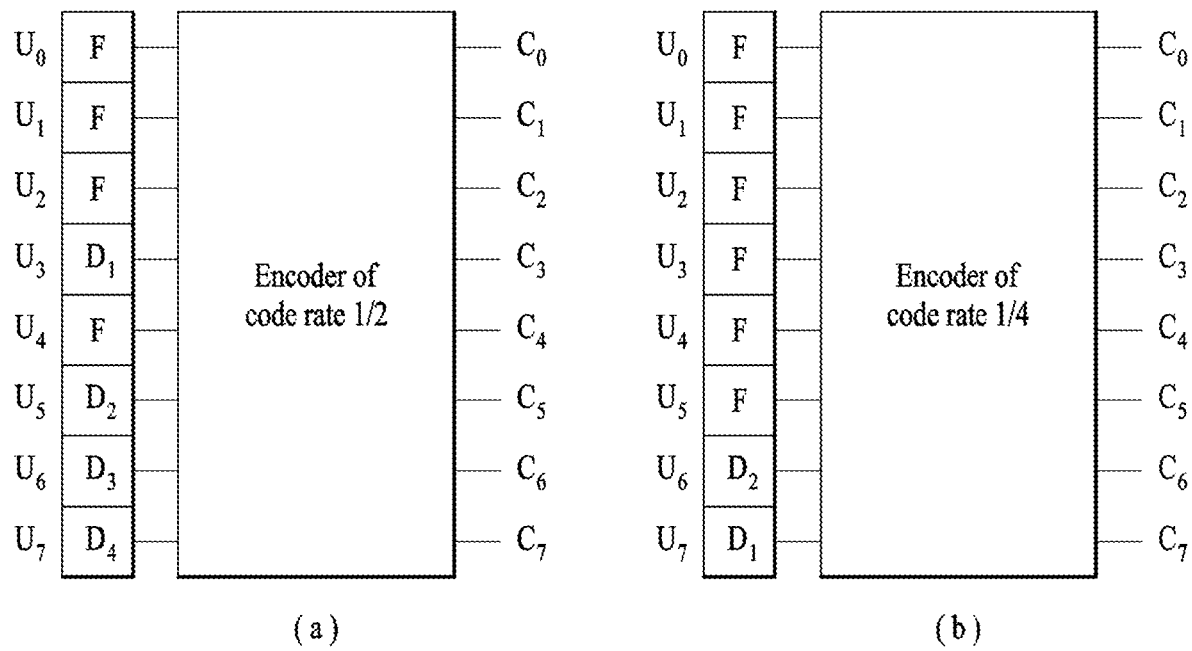
FIG. 28 illustrates a retransmission scheme according to a third example.
Figure 28:
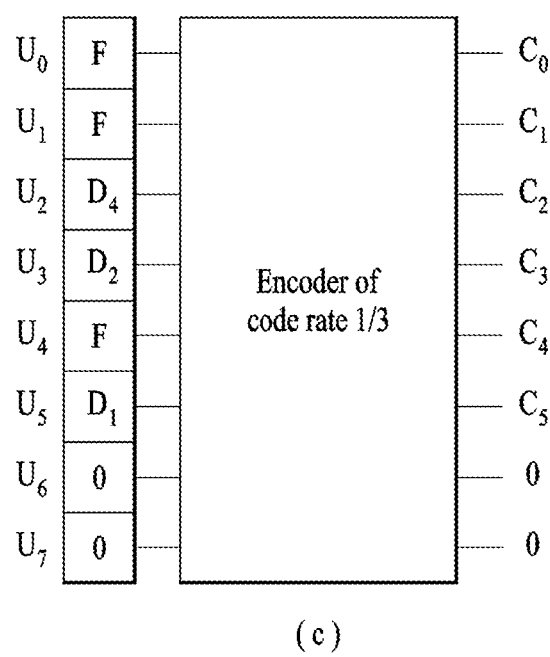

FIG. 28 illustrates a retransmission scheme according to a third example.

In FIG. 28, data bits $D_1$, $D_2$, $D_3$, and $D_4$ or frozen bits F are mapped to input bits. An encoder encodes the input bits to a coded bits $c_0$, $c_1$, $c_2$, $c_3$, $c_4$, $c_5$, $c_6$, and $c_7$. The frozen bits and the data bits may be determined based on priority described above. In FIG. 28, shortening bits are denoted by '0'. In addition, in an output stage, '0' means a bit which is not transmitted.

In the third example, a code rate during retransmission may be changed by increasing the frozen bits. The code rate of first transmission ((a) of FIG. 28) is ½, the code rate of retransmission is ¼ in (b) of FIG. 28, and the code rate of retransmission is ⅓ in (c) of FIG. 28. A description of (a) of FIG. 28 is as given with reference to (a) of FIG. 27.

In (b) of FIG. 28, change of a code rate considering maximum transmittable parity bits is illustrated. That is, when two data bits are retransmitted, the code rate is changed to ¼ in consideration of the length of maximum transmittable parities. Therefore, two data bits are changed to frozen bits. In addition, the data bits may be mapped based on priority of the remaining input bits except for input bits to which frozen bits are mapped. Change to frozen bits may be performed based on priority.

In (c) of FIG. 28, the shortening scheme is applied to some bits to change the code rate. As described above, the shortening scheme may be applied to data bits having a high priority. In this embodiment, a part '0' among coded bits is not transmitted. That is, some parity bits are not transmitted. In other words, it may be appreciated that 2-bit shortening is applied to retransmitted parity bits. For example, when a parity bits are shortened, a input bits are shortened and data bits may be sequentially mapped to the remaining input bits according to priority of the input bits. In addition, frozen bits may be applied to input bits except for the shortened bits and the data bits.

In addition, information about, for example, a code rate of retransmission or a value indicating the code rate may be transmitted to the receiver. In addition, information about shortening/puncturing/additional frozen bits may be transmitted to the receiver. For example, the receiver may be aware of a data bit mapping order and/or location from a received signal based on priority information used for data/frozen bit determination in first transmission.

Hereinafter, a decoding scheme to support IR HARQ will be described.

With reference to FIG. 26, a retransmission module may be added during every retransmission as described above. In this case, each retransmission module may perform independent decoding. Accordingly, decoding may be performed using a decoded result in each retransmission.

For example, an LLR value of a decoded bit may be updated in reception of every retransmission. For example, update of the LLR value may be performed using the following equation.

$$L(\hat{u}_j) = \Pi_c L(\hat{u}_{j,c}) \qquad \text{Equation 19}$$

In the above equation, L(a) denotes an LLR value for a, $\hat{u}_j$ denotes j-th data, and $\hat{u}_{j,c}$ indicates that the total number of receptions of corresponding data is c.

Re-decoding for first received data may be performed. A decoding scheme for a polar code base module may be performed as described above in relation to Equation 11 to Equation 14. In this case, an XOR operation may be performed using an LLR value for even-numbered data. Therefore, the reliability of odd-numbered data may increase by additionally using an LLR value of decoded data from retransmission. Since a hard decision value for the odd-numbered data is used for the even-numbered data, the reliability of the even-numbered data may also increase.

Figure 29:
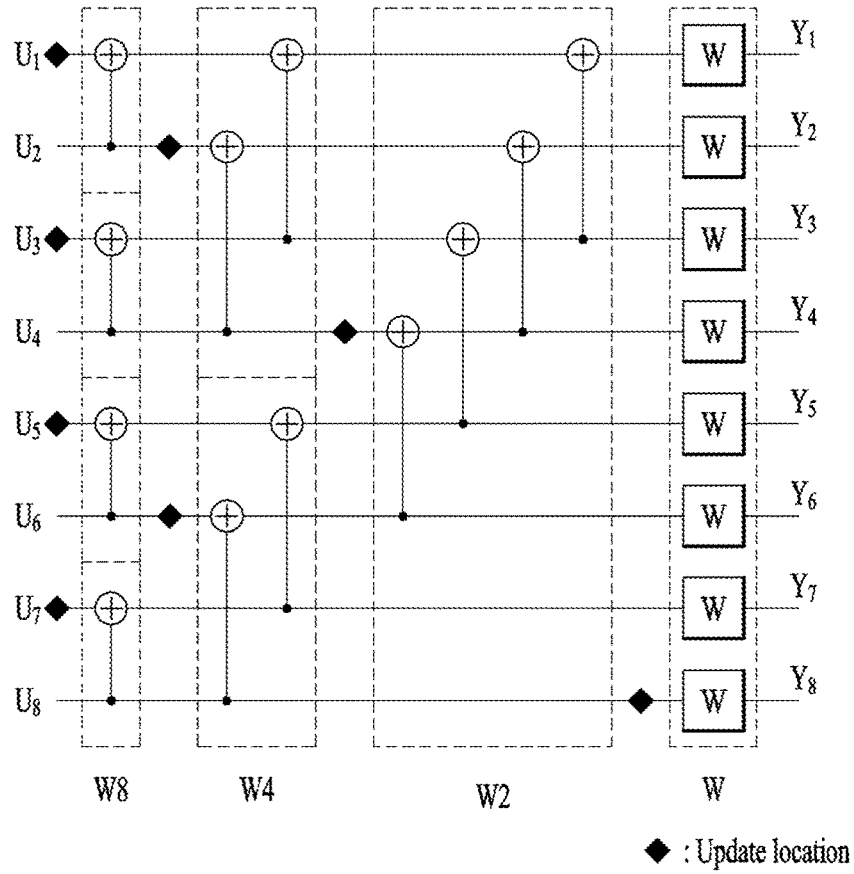
FIG. 29 illustrates an exemplary update location of an LLR value.

FIG. 29 illustrates an exemplary update location of an LLR value.

FIG. 29 illustrates an update location of an LLR value when a channel size is 8. Update for odd-numbered data may be performed using Equation 19. Update for even-numbered data may be performed using the following equation.

$$L_N^{2i}(y_1^N, \hat{u}_1^{2i-1}) = L_N^{2i}(y_1^N, \hat{u}_1^{2i-1}) \cdot \alpha_{N,2i} \Pi_c L(\hat{u}_{2i,c}) \qquad \text{Equation 20}$$

where N denotes the size of a channel and $\alpha_{N,2i}$ represents whether 2i-th data is updated in a data channel $W_N$ and has a value of 0 or 1. For example, in FIG. 29, $\alpha_{N,2i}$ is listed in Table 2 shown below.

TABLE 2

| | $W_N$ | | |
|---|---|---|---|
| 2i | N = 4 | N = 2 | N = 1 |
| 2 | 1 | 0 | 0 |
| 4 | 0 | 1 | 0 |
| 6 | 1 | 0 | 0 |
| 8 | 0 | 0 | 0 |

$\alpha_{N,2i}$ may be determined by the following equation.

$$\alpha_{N,k} = \begin{cases} 1, & \text{if } f(n, N, k) = 1 \\ 0, & \text{if } f(n, N, k) = 0 \end{cases} \qquad \text{Equation 21}$$

$$f(n, N, k) = \begin{cases} \left(\frac{g(n, 2N, k)}{2}\right) \%2, & 1 \le N \le 2^{n-1} \\ 0, & N = 2^n \end{cases} \qquad \text{Equation 22}$$

-continued $$g(n, N, k) = \left(\frac{k}{2^{n-\log_2 N}}\right) \times (1 - f(n, N, k)) \qquad \text{Equation 23}$$

According to the above-described method, LLR values of decoded data from first transmission to (p−1)-th transmission using decoded data for p-th transmission (i.e., (p−1)-th retransmission).

Figure 30:
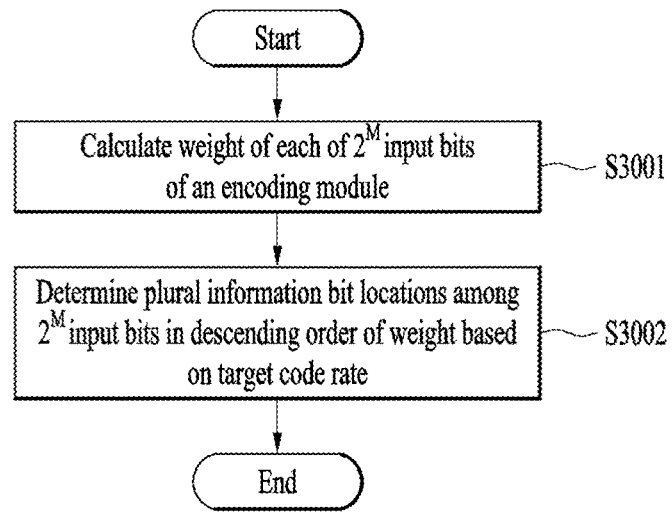
FIG. 30 is a flowchart of an exemplary frozen bit location determination method.

FIG. 30 is a flowchart of an exemplary frozen bit location determination method.

The frozen bit location determination method described below may be performed by a transmitter. For example, the transmitter may be a UE or a BS. Although details are omitted for convenience of description, the above-described embodiments may be incorporated into the frozen bit location determination method described below.

The transmitter may calculate a weight of each of $2^M$ input bits of an encoding module (S3001). For example, the weight of the input bit may be calculated using Equation 18. Herein, M is a natural number equal to or larger than 1. The encoding module may be formed by extending a base matrix as described above with reference to Equation 3 to Equation 5.

The transmitter may determine a plurality of information bit locations among the input bits in descending order of weight based on a target code rate (S3002). In this case, the remaining input bits which are not determined to be the information bit locations may be determined to be frozen bit locations.

In addition, information about the input bits may be written in a memory block based on the determined weights. For example, the information about the input bits may be written in the memory block according to the above-described method in regard to FIG. 20.

As described above, shortening may be used. For example, the transmitter may change information bit locations corresponding in number to the length of shortening bits among the plural information bit locations to the frozen bit locations in descending order of weight. The transmitter may perform puncturing after encoding input data. For example, the transmitter may puncture at least one bit of coded input data based on the target code rate.

The transmitter may change the information bit locations corresponding in number to the length of shortening bits among the plural information bit locations to the frozen bit locations in ascending order of weight. For example, the transmitter may determine the length of the shortening bits as a value obtained by dividing the length of the shortening bits by the target code rate. The transmitter may perform puncturing after encoding the input data. For example, the transmitter may puncture at least one bit of the coded input data based on the target code rate. In this case, the transmitter may perform puncturing corresponding to a value obtained by subtracting the length of the shortening bits from the number of information bits changed to the frozen bit locations.

Figure 31:
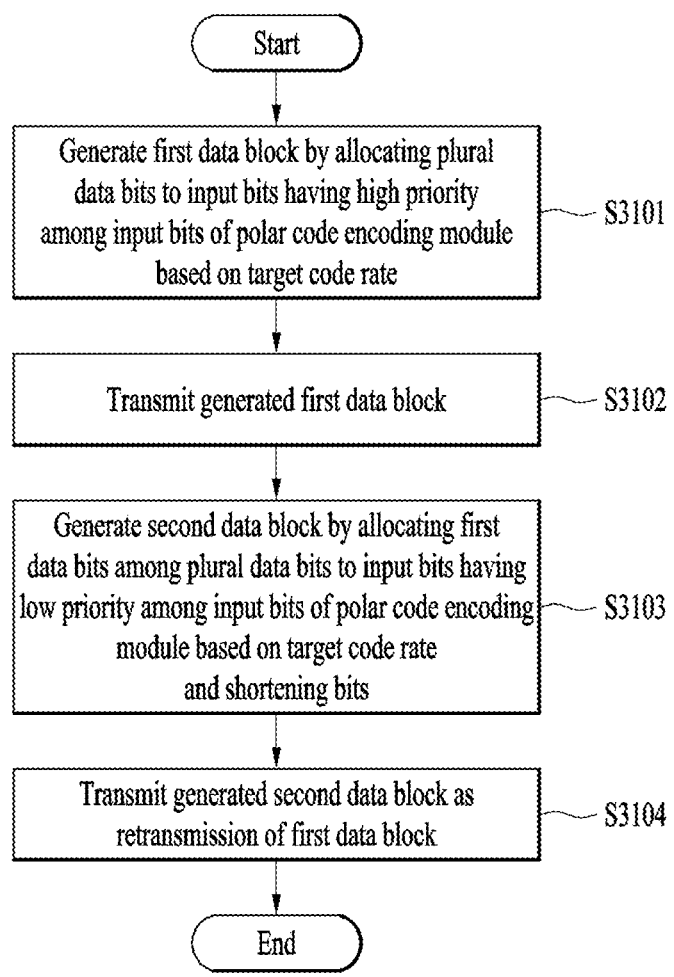
FIG. 31 is a flowchart of an exemplary retransmission method in a polar code.

FIG. 31 is a flowchart of an exemplary retransmission method in a polar code.

The frozen bit location determination method described below may be performed by a transmitter. For example, the transmitter may be a UE or a BS. Although details are omitted for convenience of description, the above-described embodiments may be incorporated into the retransmission method described below.

The transmitter may generate a first data block by allocating a plurality of data bits to input bits having a high priority among input bits of a polar code encoding module based on a target code rate (S3101). The transmitter may transmit the generated first data block to a receiver (S3102). For example, the first data block may correspond to a transport block or a code block. The first data block may be configured by the transport block and CRC for the transport block or by the code block and CRC for the code block.

The transmitter may generate a second data block by allocating first data bits among the plural data bits to input bits having a low priority among the input bits of the polar code encoding module based on the target code rate and shortening bits (S3103). In this case, the first data bits may be selected from among the plural data bits in ascending order of reliability. The transmitter may transmit the second data block as retransmission of the first data block (S3104).

The transmitter may generate a third data block by allocating second data bits among the remaining data bits except for the first data bits from the plural data bits to input bits having a low priority among the input bits of the polar code encoding module based on the target code rate and shortening bits. The transmitter may transmit the third data block as retransmission of the first data block. In this case, the second data bits may be selected from among the remaining data bits in ascending order of reliability.

If all of the plural data bits which are first transmitted by retransmission are retransmitted, the transmitter may selectively transmit at least a part of the plural data bits in descending order of reliability.

Retransmission of the first data block may be performed based on a NACK response from the receiver.

Figure 32:
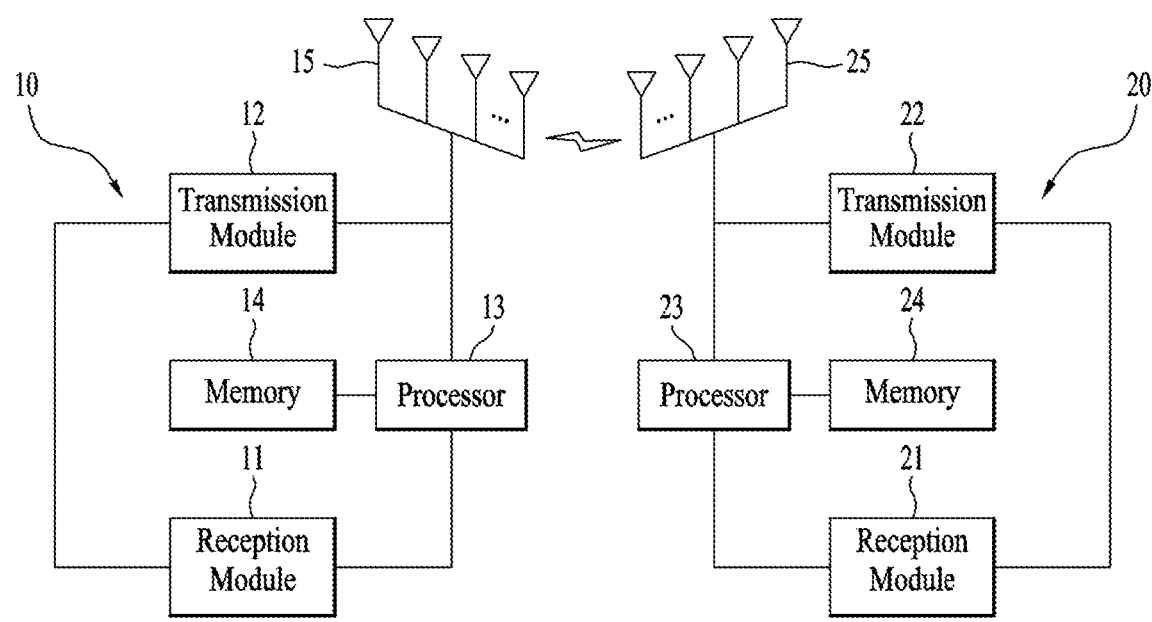
FIG. 32 illustrates configurations of a base station and a user equipment according to an embodiment of the present invention.

FIG. 32 is a diagram schematically illustrating configurations of devices to which embodiments of the present described with reference to FIGS. 1 to 31 is applicable according to an embodiment of the present invention.

Referring to FIG. 32, a BS 10 according to the present invention may include a reception module 11, a transmission module 12, a processor 13, a memory 14, and a plurality of antennas 15. The transmission module 12 may transmit a variety of signals, data, and information to an external device (e.g., UE). The reception module 11 may receive a variety of signals, data, and information from the external device (e.g., UE). The reception module 11 and the transmission module 12 may be referred to as a transceiver. The processor 13 may control overall operation of the BS 10. The plural antennas 15 may be configured according to, for example, a 2-dimensional antenna arrangement.

The processor 13 of the BS 10 according to an example of the present invention may be configured to receive channel state information according to the examples proposed in the present invention. The processor 13 of the BS 10 processes information received by the BS 10 and information to be transmitted to the outside of the BS 10. The memory 14 may store the processed information for a predetermined time and may be replaced with a component such as a buffer (not shown).

Referring to FIG. 32, a UE 20 according to the present invention may include a reception module 21, a transmission module 22, a processor 23, a memory 24, and a plurality of antennas 25. Use of the plurality of antennas 25 means that the UE 20 supports Multiple Input Multiple Output (MIMO) transmission and reception using the plurality of antennas 25. The transmission module 22 may transmit a variety of signals, data, and information to an external device (e.g., BS). The reception module 21 may receive a variety of signals, data, and information from the external device (e.g., BS). The reception module 21 and the transmission module 22 may be referred to as a transceiver. The processor 23 may control overall operation of the BS 10.

The processor 23 of the UE 10 according to an example of the present invention may be configured to transmit channel state information according to the examples proposed in the present invention. The processor 23 of the UE 20 processes information received by the UE 20 and information to be transmitted to the outside of the UE 10. The memory 24 may store the processed information for a predetermined time and may be replaced with a component such as a buffer (not shown).

The detailed configurations of the UE 10 may be implemented such that the above-described various embodiments of the present invention are independently applied or two or more embodiments of the present invention are simultaneously applied. Redundant matters will not be described herein for clarity.

In described various embodiments of the present invention, while the BS has been mainly described as an example of a downlink transmission entity or an uplink reception entity and the UE has been mainly described as an example of a downlink reception entity or an uplink transmission entity, the scope of the present invention is not limited thereto. For example, a description of the BS may be identically applied when a cell, an antenna port, an antenna port group, a remote radio head (RRH), a transmission point, a reception point, an access point, or a relay is a downlink transmission entity to the UE or an uplink reception entity from the UE. In addition, the principle of the present invention described through various embodiments of the present invention may be identically applied to a relay acting as a downlink transmission entity to the UE or an uplink reception entity from the UE, or a relay acting as an uplink transmission entity to the BS or a downlink reception entity from the BS.

The embodiments of the present invention may be implemented by various means, for example, hardware, firmware, software, or a combination thereof.

In a hardware configuration, the method according to the embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, or microprocessors.

In a firmware or software configuration, the method according to the embodiments of the present invention may be implemented in the form of modules, procedures, functions, etc. performing the above-described functions or operations. Software code may be stored in a memory unit and executed by a processor. The memory unit may be located at the interior or exterior of the processor and may transmit and receive data to and from the processor via various known means.

The embodiments described above are combinations of components and features of the present invention in a prescribed form. Each component or feature may be considered selective unless explicitly mentioned otherwise. Each component or feature may be executed in a form that is not combined with other components and features. Further, some components and/or features may be combined to configure an embodiment of the present invention. The order of operations described in the embodiments of the present invention may be changed. Some components or features of an embodiment may be included in another embodiment or may be substituted with a corresponding component or feature of the present invention. It is obvious to those skilled in the art that claims that are not explicitly cited in each other in the appended claims may be presented in combination as an embodiment of the present invention or included as a new claim by subsequent amendment after the application is filed.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all changes which come within the equivalent scope of the invention are within the scope of the invention.

INDUSTRIAL APPLICABILITY

The embodiments of the present invention are applicable to various wireless access systems and broadcast communication systems. The wireless access systems include, for example, a 3GPP system, a 3GPP2 system, and/or an IEEE 802.xx system. The embodiments of the present invention may be applied not only to the wireless access systems but also to all technical fields employing the wireless access systems.

The invention claimed is:

1. A method of retransmitting a data block by a user equipment, the method comprising:
generating a first data block by allocating a plurality of data bits to input bits having a high priority among input bits of a polar code encoding module based on a target code rate;
transmitting the generated first data block;
generating a second data block by allocating first data bits among the plurality of data bits to input bits having a low priority among the input bits of the polar code encoding module based on the target code rate and shortening bits; and
transmitting the generated second data block as retransmission of the first data block,
wherein the first data bits are selected from among the plurality of data bits in ascending order of reliability, and
wherein a length of the shortening bits is determined by dividing (i) a length of bits except for the first data bits from the plurality of data bits by (ii) the target code rate.

2. The method of claim 1, further comprising:
generating a third data block by allocating second data bits among remaining data bits except for the first data bits among the plurality of data bits to input bits having a low priority among the input bits of the polar code encoding module based on the target code rate and the shortening bits; and
transmitting the generated third data block as retransmission of the first data block,
wherein the second data bits are selected from among the remaining data bits in ascending order of reliability.

3. The method of claim 2, further comprising
selectively transmitting at least a part of the plurality of data bits in descending order of reliability when all of the plurality of data bits are retransmitted due to repetitive retransmission of the first data block.

4. The method of claim 1,
wherein the first data block corresponds to a transport block or a code block.

5. The method of claim 1,
wherein retransmission of the first data block is performed based on a negative acknowledgement response from a receiving end.

6. A user equipment configured to operate in a wireless communication system, the user equipment comprising:
a transceiver;
a memory; and
a processor configured to control for the transceiver and the memory,
wherein the processor is configured to:
generate a first data block by allocating a plurality of data bits to input bits having a high priority among input bits of a polar code encoding module based on a target code rate,
transmit the generated first data block,
generate a second data block by allocating first data bits among the plurality of data bits to input bits having a low priority among the input bits of the polar code encoding module based on the target code rate and shortening bits, and
transmit the generated second data block as retransmission of the first data block,
wherein the first data bits are selected from among the plurality of data bits in ascending order of reliability, and
wherein a length of the shortening bits is determined by dividing (i) a length of bits except for the first data bits from the plurality of data bits by (ii) the target code rate.

7. The user equipment of claim 6, wherein the processor is further configured to:
generate a third data block by allocating second data bits among remaining data bits except for the first data bits among the plurality of data bits to input bits having a low priority among the input bits of the polar code encoding module based on the target code rate and the shortening bits; and
transmit the generated third data block as retransmission of the first data block, and
wherein the second data bits are selected from among the remaining data bits in ascending order of reliability.

8. The user equipment of claim 7,
wherein the processor is further configured to selectively transmit at least a part of the plurality of data plural bits in descending order of reliability when all of the plurality of data bits are retransmitted due to repetitive retransmission of the first data block.

9. The user equipment of claim 6,
wherein the first data block corresponds to a transport block or a code block.

10. The user equipment of claim 6,
wherein retransmission of the first data block is performed based on a negative acknowledgement response from a receiving end.

* * * * *